(12) United States Patent
Tsuchiya et al.

(10) Patent No.: US 7,619,258 B2
(45) Date of Patent: Nov. 17, 2009

(54) DISPLAY DEVICE

(75) Inventors: Kaoru Tsuchiya, Kanagawa (JP); Hideyuki Ebine, Chiba (JP); Masayuki Sakakura, Kanagawa (JP); Takeshi Nishi, Kanagawa (JP); Yoshiharu Hirakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 241 days.

(21) Appl. No.: 11/077,347

(22) Filed: Mar. 10, 2005

(65) Prior Publication Data

US 2005/0218396 A1 Oct. 6, 2005

(30) Foreign Application Priority Data

Mar. 16, 2004 (JP) ............................. 2004-075428

(51) Int. Cl.
*H01L 27/32* (2006.01)
(52) U.S. Cl. .............................. 257/83; 257/59; 257/72; 257/84; 257/98; 257/99; 257/40; 257/763; 257/E27.111; 257/E29.117; 257/E29.147; 438/22; 438/24; 313/504
(58) Field of Classification Search .................. 257/40, 257/59, 49, 79, 83, 84, 98, 72, 99, 763, E27.111, 257/E29.117, E29.147; 313/504
See application file for complete search history.

(56) References Cited

U.S. PATENT DOCUMENTS

| 5,684,365 | A | 11/1997 | Tang et al. | |
|---|---|---|---|---|
| 5,882,761 | A | 3/1999 | Kawami et al. | 428/69 |
| 6,016,033 | A | 1/2000 | Jones et al. | |
| 6,359,606 | B1 | 3/2002 | Yudasaka | |
| 6,424,401 | B1 | 7/2002 | Kang et al. | |
| 6,476,988 | B1 | 11/2002 | Yudasaka | |
| 6,605,826 | B2 | 8/2003 | Yamazaki et al. | |
| 6,646,284 | B2 | 11/2003 | Yamazaki et al. | |
| 6,664,732 | B2 | 12/2003 | Yamazaki et al. | |

(Continued)

FOREIGN PATENT DOCUMENTS

CN 1419297 A 5/2003

(Continued)

OTHER PUBLICATIONS

Office Action re Chinese application No. CN 200510055811.2, dated Oct. 24, 2008 (with English translation).

*Primary Examiner*—M. Wilczewski
*Assistant Examiner*—Tsz K Chiu
(74) *Attorney, Agent, or Firm*—Cook Alex Ltd.

(57) ABSTRACT

In a light emitting device using a light emitting element, the invention provides a sealing structure capable of preventing ingress of moisture from the outside and obtaining adequate reliability. The light emitting device has a light emitting element comprising a light emitting layer formed between a first electrode and a second electrode and a pixel portion comprising the light emitting element. The entire surface of the pixel portion is covered with the second electrode. An impermeable insulating film is formed in contact with the first electrode of the light emitting element. The edge of the first electrode and the impermeable insulating film are covered with a partition wall. An opening is formed along the circumference of the pixel portion in the partition wall. The opening passes through the partition wall in the thickness direction, and the side wall and the bottom face thereof are covered with the second electrode.

26 Claims, 19 Drawing Sheets

U.S. PATENT DOCUMENTS

| | | | |
|---|---|---|---|
| 6,717,181 B2 | 4/2004 | Murakami et al. | |
| 6,781,162 B2 | 8/2004 | Yamazaki et al. | |
| 6,781,746 B2 | 8/2004 | Yamazaki et al. | |
| 6,828,727 B2 | 12/2004 | Yamazaki | |
| 6,833,560 B2 | 12/2004 | Konuma et al. | |
| 6,861,297 B2 | 3/2005 | Kwak et al. | |
| 6,864,508 B2 | 3/2005 | Yamazaki et al. | |
| 6,903,377 B2 | 6/2005 | Yamazaki et al. | |
| 6,906,773 B2 | 6/2005 | Choi | |
| 6,982,779 B2 | 1/2006 | Park et al. | |
| 6,992,439 B2 | 1/2006 | Yamazaki et al. | |
| 7,042,024 B2 | 5/2006 | Yamazaki et al. | |
| 7,112,115 B1 | 9/2006 | Yamazaki et al. | |
| 7,129,523 B2 | 10/2006 | Yamazaki et al. | |
| 7,190,115 B2 | 3/2007 | Tsuchiya et al. | |
| 7,265,391 B2 | 9/2007 | Yamazaki et al. | |
| 7,432,529 B2 | 10/2008 | Yamazaki et al. | |
| 2001/0002703 A1* | 6/2001 | Koyama | 257/40 |
| 2001/0017684 A1 | 8/2001 | Hirakata et al. | 349/153 |
| 2002/0011975 A1 | 1/2002 | Yamazaki et al. | 345/76 |
| 2002/0025591 A1 | 2/2002 | Ohnuma et al. | 438/30 |
| 2002/0044111 A1 | 4/2002 | Yamazaki et al. | |
| 2002/0113248 A1 | 8/2002 | Yamagata et al. | |
| 2003/0094615 A1 | 5/2003 | Yamazaki et al. | 257/72 |
| 2003/0122978 A1 | 7/2003 | Lim | |
| 2003/0227021 A1* | 12/2003 | Yamazaki et al. | 257/83 |
| 2004/0232418 A1 | 11/2004 | Koyama et al. | |
| 2004/0263740 A1 | 12/2004 | Sakakura et al. | |
| 2005/0045891 A1 | 3/2005 | Yamazaki et al. | |
| 2005/0046346 A1 | 3/2005 | Tsuchiya et al. | |

FOREIGN PATENT DOCUMENTS

| | | |
|---|---|---|
| EP | 0 776 147 A1 | 5/1997 |
| JP | 07-169567 | 7/1995 |
| JP | 09-148066 | 6/1997 |
| JP | 10-335060 | 12/1998 |
| JP | 2001-203076 | 7/2001 |
| JP | 2001-357973 | 12/2001 |
| JP | 2002-329576 | 11/2002 |
| JP | 2003-297552 | 10/2003 |

* cited by examiner

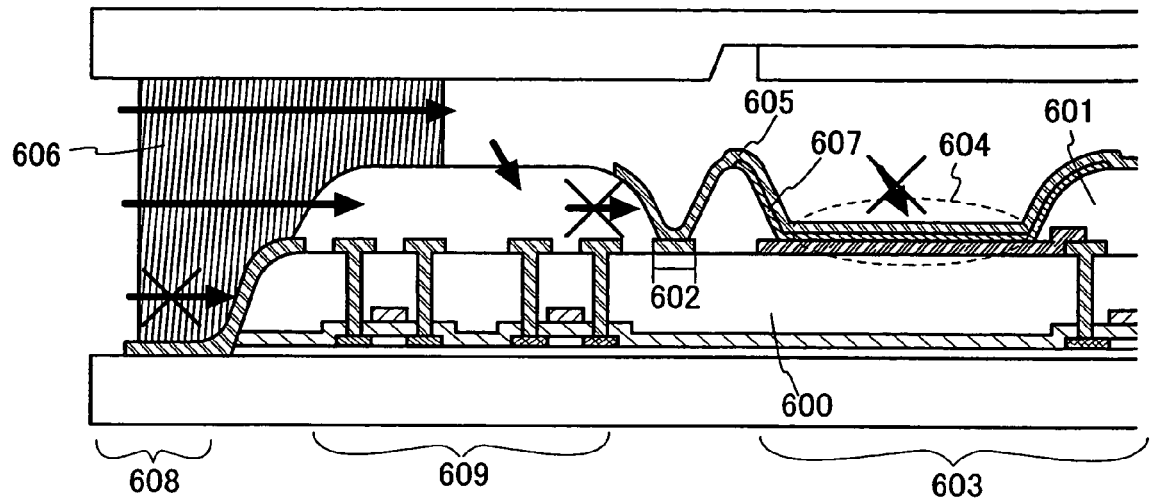
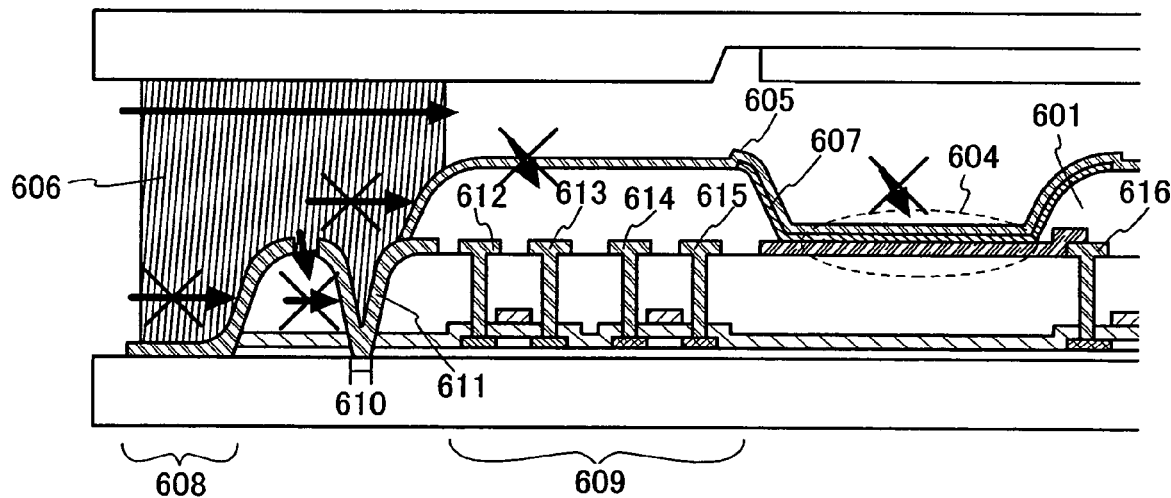

FIG. 16A
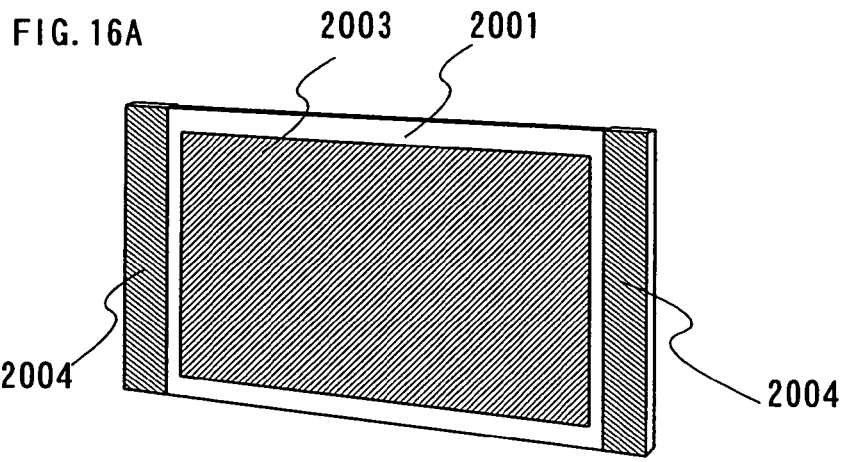
FIG. 16B
FIG. 16C
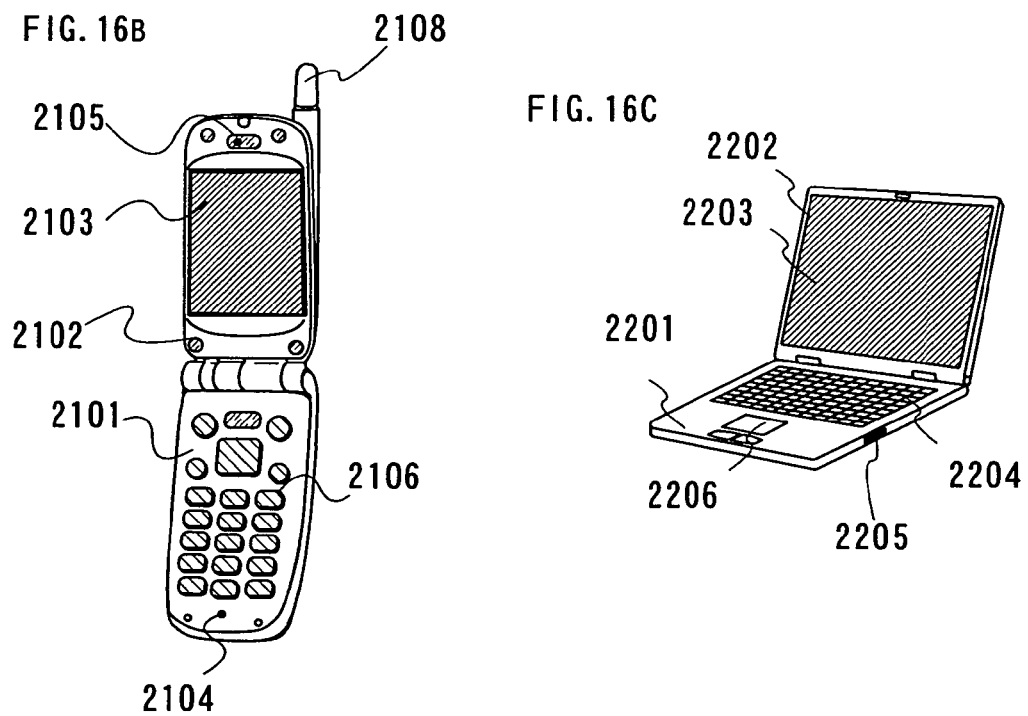
FIG. 16D
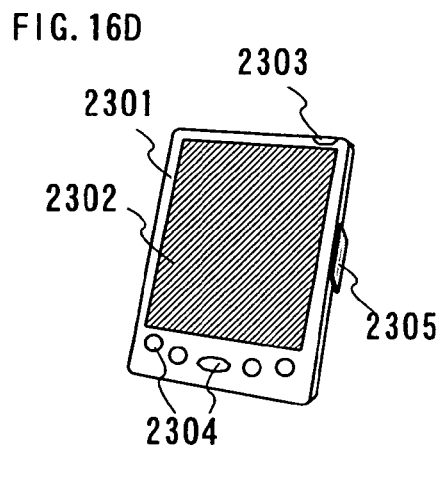
FIG. 16E
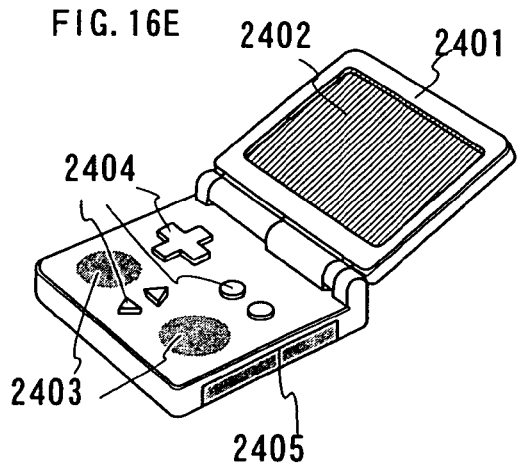

DISPLAY DEVICE

BACKGROUND OF THE INVENTION

1. Field of the Invention

The present invention relates to a display device comprising element (a light emitting element) which is a light emitting material formed between electrodes, and emits light upon flowing a current between electrodes, and in particular, relates to a sealing structure of a light emitting device.

2. Description of the Related Art

In recent years, development related to a flat panel display device using a light emitting element has been carried out actively. The light emitting element is formed by a material that emits light upon flowing a current between a pair of electrodes. Differing from a liquid crystal, the light emitting element emits light by itself without using a backlight, and is extremely thin in itself. Therefore, the light emitting element is very advantageous to form a flat panel display device.

The reliability problem is one of the factors in which the light emitting element has not been put to practical use although the light emitting element has such good advantages. The light emitting element using an organic material is easily deteriorated due to moisture (water) and has a drawback in which long-time reliability is difficultly obtained. The light emitting element deteriorated by water results in decrease in luminance or non-light emission. It has been thought that these defects might cause dark spots (black spots) or shrinkage (which is a deterioration in luminance caused from the end of a light emitting device) in a light emitting device. Therefore, various measures have been proposed to prevent such deteriorations (e.g., see patent documents 1 and 2).

[Patent document 1]: Japanese Patent Application Laid-Open No. Hei 9-148066

[Patent document 2]: Japanese Patent Application Laid-Open No. Hei 7-169567

However, the above measures have not overcome the above-mentioned problems and an adequate level of reliability has not been obtained. Accordingly, reliability improvement has been further expected.

SUMMARY OF THE INVENTION

In view of the above problems, it is an object of the invention to provide a sealing structure of a light emitting device (an active matrix display) using an organic or inorganic light emitting element, wherein influence of moisture intruding from the outside can be prevented so as to obtain an adequate level of reliability.

One aspect of a light emitting device according to the present invention will be described below. The light emitting device of the invention having a light emitting element comprising a light emitting layer formed between a first electrode and second electrode. The light emitting device further includes a light emitting element formed in a pixel portion, and the second electrode covers the pixel portion. An insulating film with a low water permeability(an insulating film with a low permeability with respect to water) formed in contact with the first electrode, and a partition wall formed over an edge of the first electrode and formed over the insulating film. An opening formed so as to provide around a circumference of the pixel portion and formed in the partition wall. The opening is formed to pass through the partition wall in the thickness direction. The side and bottom faces of the opening are covered with the second electrode. The light emitting device having this structure can overcome the above-mentioned problems.

Another aspect of a light emitting device according to the invention will be described below. The light emitting device of the invention having a light emitting element comprising a light emitting layer formed between a first electrode and second electrode. The light emitting device further includes a pixel portion formed of the light emitting element, and a thin film transistor. The second electrode covers the pixel portion. A first interlayer insulating film formed to cover the thin film transistor and an insulating film with a low water permeability formed to cover the first interlayer insulating film. A second interlayer insulating film formed over the insulating film. The first electrode is formed on the second interlayer insulating film. A first opening former so as to provide around a circumference of the pixel portion and formed in the second interlayer insulating film. The first opening is formed to pass through the second interlayer insulating film in the thickness direction. A partition wall formed over an edge of the first electrode and a second opening which is provided in an identical portion with the first opening(corresponding to the first opening) and formed in the partition wall. In other words, the first opening overlaps the second opening. The second opening is formed to pass through the partition wall in the thickness direction. The bottom face of the second opening is positioned inside of the bottom face of the first opening. The side and bottom faces of the second opening are covered with the second electrode. The light emitting device of the invention having the above structure can overcome the above-mentioned problems.

Another aspect of a light emitting device according to the invention will be described below. The light emitting device of the invention having a light emitting element comprising a light emitting layer formed between a first electrode and second electrode, and formed in the pixel portion. The light emitting device further includes a pixel portion formed of the light emitting element, and a thin film transistor. The second electrode covers the pixel portion. A first interlayer insulating film made from a material with a low water permeability is formed on the thin film transistor and a second interlayer insulating film is formed thereon. A first interlayer insulating film made from a material with a low water permeability is formed to cover the thin film transistor. A second interlayer insulating film formed over the insulating film. A first opening former so as to provide around a circumference of the pixel portion and formed in the second interlayer insulating film. The first opening is formed to pass through the second interlayer insulating film in the thickness direction. A partition wall f formed over an edge of the first electrode. a second opening which is provided in an identical portion with the first opening(corresponding to the first opening) and formed in the partition wall. In other words, the first opening overlaps the second opening. The second opening passes through the partition wall in the thickness direction and the bottom face of the second opening is positioned inside of the bottom face of the first opening. The side and bottom faces of the second opening are covered with the second electrode. The light emitting device of the invention having the structure can overcome the above-mentioned problems.

Still another aspect of a light emitting device according to the invention will be described below. The light emitting device of the invention having a light emitting element comprising a light emitting layer formed between a first electrode and second electrode, and formed in the pixel portion. The light emitting device further includes a pixel portion formed of the light emitting element, and a thin film transistor. The second electrode covers the pixel portion. An opening former so as to provide around at least a part of a circumference of the pixel portion and formed in the interlayer insulating film. The opening is formed to pass through the interlayer insulating film in the thickness direction. The side and bottom faces of the opening are covered with an insulating film with a low water permeability. The first electrode is formed over the interlayer insulating film and a partition wall formed over an edge of the first electrode. the partition wall formed in contact with the insulating film and covering the second electrode. And side and bottom faces of the opening are covered with an insulating film with a low water permeability. The light emitting device of the invention having the above structure can overcome the above-mentioned problems.

Yet another aspect of a light emitting device according to the invention will be described below. The light emitting device of the invention having a light emitting element comprising a light emitting layer formed between a first electrode and second electrode, and formed in the pixel portion. The light emitting device further includes a pixel portion formed of the light emitting element, and a thin film transistor. The second electrode covers the pixel portion. A first interlayer insulating film formed to cover the thin film transistor. An opening former so as to provide around at least a part of a circumference of the pixel portion and formed in the first interlayer insulating film. The opening passes through the first interlayer insulating film in the thickness direction. And the side and bottom faces of the opening are covered with an insulating film with a low water permeability. A second interlayer insulating film formed over the first interlayer insulating film, and the second interlayer insulating formed in contact with the insulating film and covering the first electrode. The first electrode is formed on the second interlayer insulating film and a partition wall is formed to cover the edge of the first electrode. The edge of the partition wall is in contact with the film with the low water permeability covering the side wall and the bottom face of the opening the partition wall formed in contact with the insulating film and covering the second electrode. The light emitting device of the invention having the above structure can overcome the above-mentioned problem.

According to the foregoing structures, the ingress of moisture into the light emitting layer can be reduced. Also, deterioration of light emitting element in the light emitting device can be prevented. Furthermore, the reliability of the light emitting device can be improved.

BRIEF DESCRIPTION OF DRAWINGS

In the accompanying drawings:

FIGS. 5A is and 5B are cross sectional views of light emitting devices according to the invention;

FIGS. 16A to 16E are examples of electronic appliances according to the invention;

DETAILED DESCRIPTION OF THE INVENTION

Figure 1A:
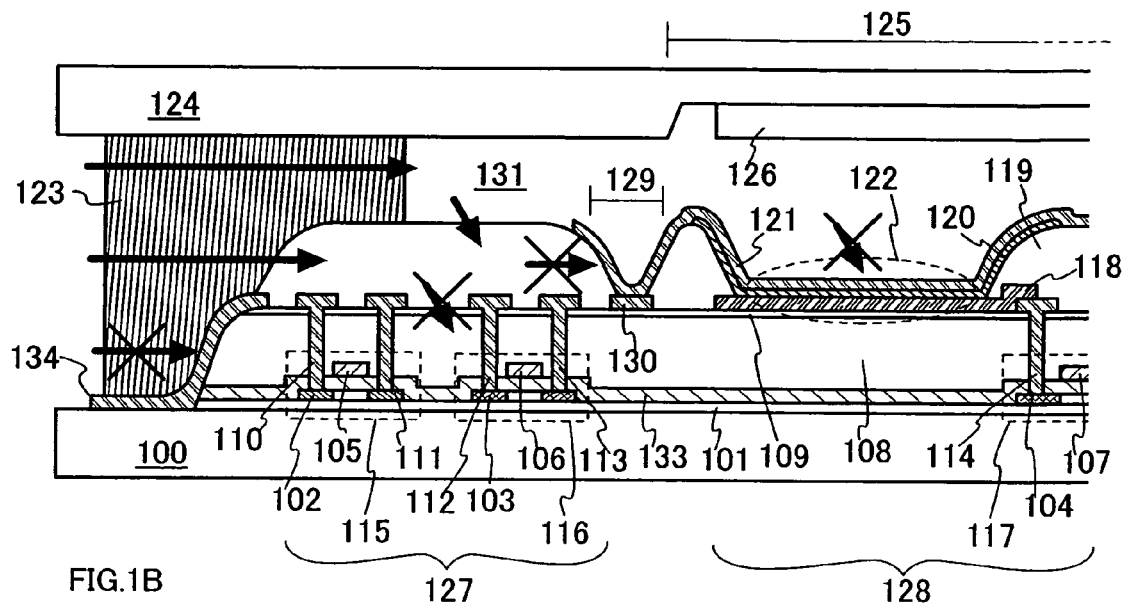
FIGS. 1A to 1C are cross sectional views of light emitting devices according to the present invention.

The embodiment modes according to the present invention will hereinafter be described with reference to the accompanying drawings. The present invention can be carried out in many different modes, and it is easily understood by those who skilled in the art that embodiments and details herein disclosed can be modified in various ways without departing from the purpose and the scope of the invention. The present invention should not be interpreted as being limited to the description of the embodiment mode to be given below.

A main purpose of the invention is to cut off a path through which moisture intruding from the outside reaches a light emitting layer of a pixel portion so as to prevent adverse effect of moisture.

Materials for forming a light emitting device include one that allows the passage of moisture easily or one that does not allow the passage of moisture easily. For example, organic materials such as acrylic and polyimide used for forming a partition wall that separates light emitting elements from one another often allow the passage of moisture easily. A material in which the skeleton structure is formed by combining with Si—O—Si and at least hydrogen is contained as a substituent, or at least one of fluorine, alkyl group and aromatic hydrocarbon is contained as its substituent, i.e., so-called siloxane is also employed as the partition wall. The siloxane is also easily permeated with moisture. Since the partition wall is directly contacted to the light emitting layer, it is concerned that moisture intrudes into the light emitting layer through the partition wall. Note that the above-mentioned materials are employed for an interlayer insulating film as well as the partition wall. When layers each of which allows the passage of moisture easily, i.e., a partition wall and an interlayer insulating film made from the above-mentioned materials are in contact with each other, it is thought that moisture moves through the partition wall and the interlayer insulating film.

Therefore, the present invention provides a structure in which a portion with a light emitting element formed therein is sealed from the outside by using a film that hardly allow the passage of moisture. This can prevent moisture intrusion from the outside from adversely affecting the light emitting element. Generally, it is known that inorganic films such as a metal film, silicon nitride, silicon oxide, silicon oxide containing nitrogen and silicon nitride containing oxygen have a low water permeability. Of course, other materials may be used if they have the low water permeability.

As a concrete structure, a pixel portion in which a light emitting element is formed is entirely covered with a second electrode. By covering the pixel portion with the second electrode, moisture intruding or remaining in an internal atmosphere within the light emitting device is prevented from reaching the light emitting layer.

Also, an insulating film with a low water permeability is formed in an upper part of a layer (e.g., an interlayer insulating film or a first interlayer insulating film) underlying a layer in which a light emitting element is formed. Alternatively, the interlayer insulating film (the first interlayer insulating film) is made from an insulating film with a low water permeability. This can prevent moisture migration to an insulating film in the side of the light emitting element (i.e., a partition wall or a second interlayer insulating film) from the interlayer insulating film (the first interlayer insulating film).

An opening is formed in the partition wall (or the partition wall and the second interlayer insulating film) so as to surround the circumference of the pixel portion. It is most important that the opening is formed to pass through at least a layer in which the opening is formed and reaches an underlying film with a low water permeability (when the second interlayer insulating film is formed, a bottom face of an opening in the partition wall is positioned inside of a bottom face of an opening in the second interlayer insulating film and these bottom faces reach a film with a low water permeability under the second interlayer insulating film). The side face and the bottom face(inner wall) thereof are covered with an electrode of the light emitting element that is formed to cover the foregoing pixel portion entirely. According to the structure, moisture reaching the light emitting layer through the partition wall can be blocked.

A configuration of the present invention will be described in more detail below.

Embodiment Mode 1

Figure 1B:
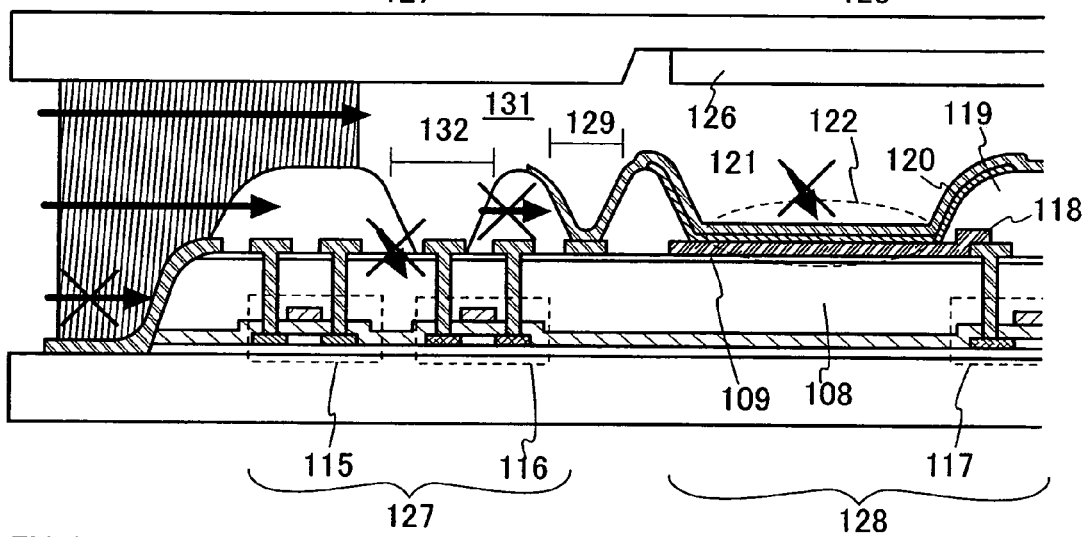
Figure 1C:
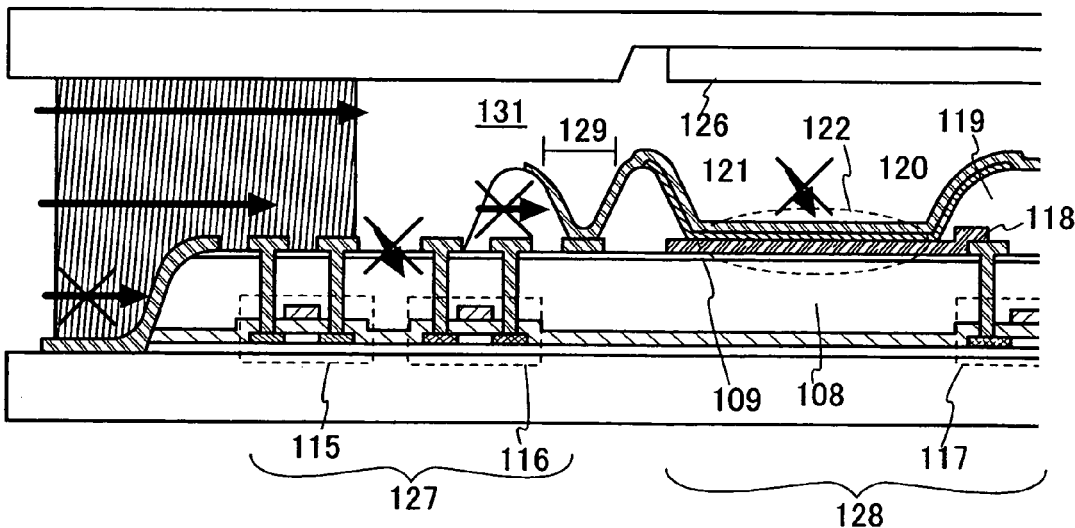

FIGS. 1A to 1C are cross sectional views of the light emitting device according to the invention. A base insulating film 101 is formed on a substrate 100. Semiconductor layers 102 to 104 are formed thereon. The base insulating film 101 and the semiconductor layers 102 to 104 are covered with a gate insulating film 133. Gate electrodes 105 to 107 are formed on the gate insulating film 133 while partly overlapping with the semiconductor layers 102 to 104. The gate insulating film 133 and the gate electrodes 105 to 107 are covered with an interlayer insulating film 108. An insulating film 109 is formed on the interlayer insulating film 108.

The substrate 100 serves to support thin film transistors and a light emitting element. The base insulating film 101 is formed to prevent a substance that adversely affects the thin film transistors from dispersing through the substrate 100. If the adverse effect due to such the substance is of no matter, the base insulating film is not necessary to be provided. The thin film transistors include the semiconductor layers 102 to 104, the gate insulating film 133 and the gate electrodes 105 to 107. The thin film transistors includes one formed in a driver circuit portion 127 that is used as a driver circuit etc. and one formed in a pixel portion 128 for driving a light emitting element 122. The driver circuit may be integrally formed over the substrate along with the pixel portion in the same manner as the present embodiment mode or may be formed separately.

In this embodiment mode, it is assumed that the interlayer insulating film 108 is made from an insulating film with a relatively high water permeability such as an organic insulating film (e.g., acrylic or polyimide) and siloxane. The insulating film 109 is formed of a film with a low water permeability such as silicon nitride, silicon nitride containing oxygen, silicon oxide containing nitrogen and silicon oxide. Note that an insulating film made from another material may be formed between the interlayer insulating film 108 and the gate insulating film 133 or the gate electrodes 105 to 107.

Electrodes (wirings) 110 to 114, which are electrically connected to the semiconductor layers 102 to 104 through contact holes formed in the insulating film 109 and the interlayer insulating film 108, are formed on the insulating film 109. A thin film transistor 115 includes the semiconductor layer 102, the gate insulating film 133, the gate electrode 105 and the electrodes (wirings) 110 and 111. A thin film transistor 116 includes the semiconductor layer 103, the gate insulating film 133, the gate electrode 106 and the electrodes (wirings) 112 and 113. The semiconductor layer 104, the gate insulating film 133, the gate electrode 107 and the electrode (wiring) 114 are a part of a thin film transistor 117. In the light emitting device, the thin film transistors 115 and 116 indicate a part of a thin film transistor of the driver circuit portion 127 and the thin film transistor 117 is one of the thin film transistors in the pixel portion 128.

A first electrode 118 is formed in contact with the electrode 114 of the thin film transistor 117 and a partition wall 119 is formed to cover the edge of the first electrode. The partition wall 119 is generally made from an organic insulating film such as acrylic and polyimide or an insulating film with a relatively high water permeability such as siloxane. And the partition wall 119 is directly contacted to a film comprises a light emitting layer (a light emitting film) 120, it is concerned that moisture reaching the light emitting film 120 through the partition wall causes decrease in reliability of the light emitting element 122.

The light emitting film 120 is formed in contact with the first electrode 118. A second electrode 121 is formed to partly cover the light emitting film 120 and the partition wall 119. The light emitting element 122 includes the first electrode 118, the second electrode 121 and the light emitting film 120 which is formed between the first electrode and the second electrode. Such a plurality of light emitting elements 122 is arranged in matrix form in the pixel portion 128.

A first opening 129 is formed around the circumference of the pixel portion 128 in the partition wall 119. The side wall and the bottom face of the first opening 129 are covered with the second electrode 121. When the driver circuit portion 127 is formed on the same substrate as the pixel portion 128 as well as the present embodiment mode, the first opening 129 is positioned between the driver circuit portion 127 and the pixel portion 128 as shown in FIG. 1A. Additionally, the present invention can, of course, be applied to a light emitting device in which a driver circuit is not integrated with a pixel portion.

The first opening 129 is formed through the partition wall 119. A contact portion 130 is formed under the first opening 129 by using the same material as the electrodes (wirings) 110 to 114 in this embodiment mode such that the insulating film 109 is well-adhered to the second electrode 121.

In the case where the insulating film 109 with a low water permeability is in contact with the second electrode 121, the connection portion 130 is not necessarily required.

If a wiring for transmitting a signal to the pixel portion 128, which is formed inside of a region surrounded by the first opening 129, is formed on the insulating film 109, the wiring is short-circuited with the second electrode 121. In order to prevent the short-circuiting, the wiring for transmitting a signal to the pixel portion 128 is connected to the wirings of the pixel portion 128 through layers of the gate electrodes 105 to 107.

The substrate 100 having the above-mentioned structure is firmly attached to a counter substrate 124 with a sealing material 123. A depression portion 125 may be formed in the counter substrate 124 to provide a drying agent therein.

According to the structure, the light emitting film 120 can be protected from moisture penetrating from the outside. Preventing the ingress of moisture can prolong the life of the light emitting element 122, which increases the reliability of the light emitting device.

Generally, an organic material with a relatively low water permeability such as an ultraviolet curing resin is used as the sealing material 123. However, such the organic material is difficult to prevent the ingress of moisture completely in the present circumstances. It is thought that moisture intrudes into the light emitting element from the outside through the sealing film due to long-term use of the sealing material. If the sealing material is not well-adhered to the substrate, the counter substrate and the like, moisture might intrude through the badly adhered portion. Therefore, it is difficult to inhibit the ingress of moisture from the outside completely by using the sealing material. It is thought that moisture, which reaches the light emitting film 120 from the outside through the sealing material, is one of causes of progressive defects. There are several paths through which moisture penetrating from the outside reaches the light emitting film 120. It is assumed that an internal atmosphere 131, the partition wall 119 and the interlayer insulating film 108 are main paths through which moisture intruding from the sealing material 123 reaches the light emitting film 120. The penetration paths of moisture are schematically illustrated by arrows in FIGS. 1A to 1C.

When the drying agent 126 is provided on the counter substrate, moisture dispersed in the internal atmosphere 131 is absorbed to some extent by the drying agent and moisture that is not absorbed by the drying agent remains in the internal atmosphere as it is or penetrates (or penetrates again) into the partition wall 119. Since the second electrode 121 has a low water permeability, moisture remaining in the internal atmosphere 131 cannot reach the light emitting film 120. Preferably, pinhole is not generated in the second electrode 121. With respect to moisture intruding from the sealing material 123 and the internal atmosphere 131 into the partition wall 119, since the second electrode 121 covering the side wall and the bottom face of the first opening 129 definitely exist in the paths thorough which the moisture reaches the light emitting film 120. Because the second electrode 121 does not allow the passage of water, the moisture cannot reach the light emitting film 120. Furthermore, moisture intruding in the interlayer insulating film 108 cannot reach the light emitting film 120 due to the existence of the insulating film 109. Accordingly, the penetration paths through which moisture intruding from the outside atmosphere reaches the light emitting film 120 are cut off in the embodiment mode, and hence, adverse effect of moisture intruding from the outside can be inhibited. Note that, in FIGS. 1A to 1C, the arrows marked by crossed indicate conditions in which further ingress of moisture into the light emitting film side is prevented by the material with the low water permeability.

As shown in FIGS. 1A to 1C, the structure in which the edge of the interlayer insulating film 108 is covered with a film 134 with a low water permeability is preferable to reduce the amount of moisture penetrating through the edge of the interlayer insulating film 108. When the film 134 with the low water permeability is made from the same material as the electrodes (wirings) 110 to 114, the contact portion 130 and the like, the film 134 can be used as a lead wiring.

FIG. 1B illustrates a structure in which a second opening 132 that reaches the underlying layer is additionally formed in the structure of FIG. 1A. The second opening 132 is formed to pass through the partition wall 119 in the thickness direction. The second opening 132 is formed around the circumference of the first opening 129 and serves to inhibit moisture, which intrudes into the partition wall 119 from the sealing material, from reaching the first opening 129 directly through the partition wall 119. This can reduce the amount of moisture reaching the first opening 129, which results in improvement of the reliability for the light emitting element 122. A portion of the partition wall 119 may be omitted as shown in FIG. 1C.

Figure 6:
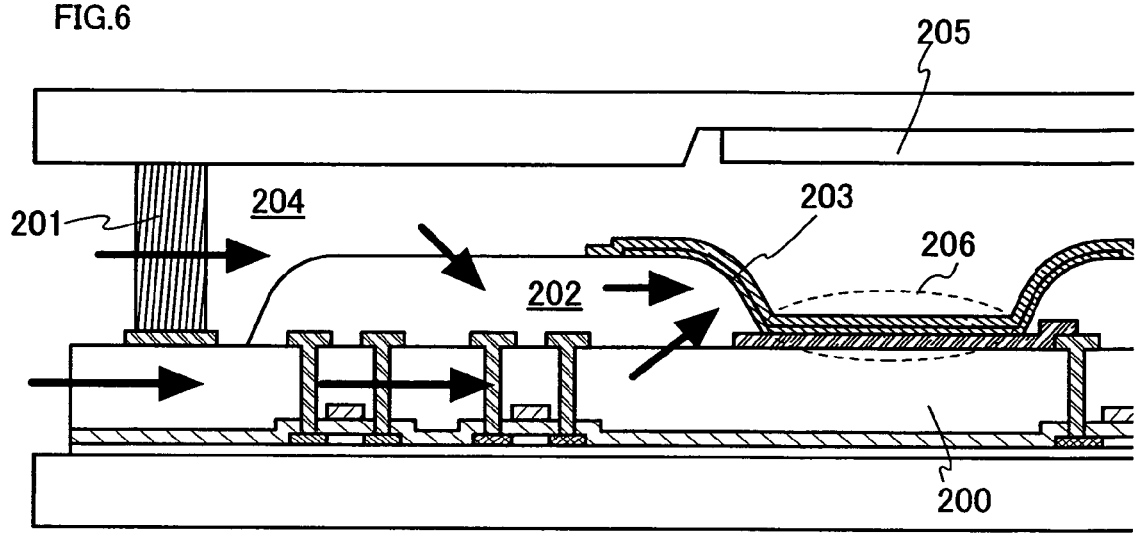
FIG. 6 is a cross sectional view of a conventional light emitting device.

Meanwhile, FIG. 6 shows a cross sectional view of a conventional light emitting device as a comparative example. Note that materials for respective component parts in FIG. 6 are identical to those in FIG. 1A in this case. In FIG. 6, moisture first penetrates through an interlayer insulating film 200 and a sealing material 201 from the outside. The moisture penetrating through the interlayer insulating film 200 further intrudes into a partition wall 202 and then reaches a light emitting film 203. The moisture penetrated through the sealing material 201 is dispersed in an internal atmosphere 204. The moisture in the internal atmosphere 204 then partly remains in the internal atmosphere 204 and partly penetrates into the partition wall 202 while being partly absorbed by a drying agent 205. The moisture intruding into the partition wall 202 reaches the light emitting film 203. The moisture reaching the light emitting film 203 deteriorates the light emitting film 203, which results in decrease in the reliability of a light emitting element 206.

Embodiment Mode 2

Another embodiment mode of the invention will be described in the present embodiment mode with reference to FIGS. 2A and 2B. Note that identical portions to those in FIGS. 1A to 1C may not be further explained.

Figure 2A:
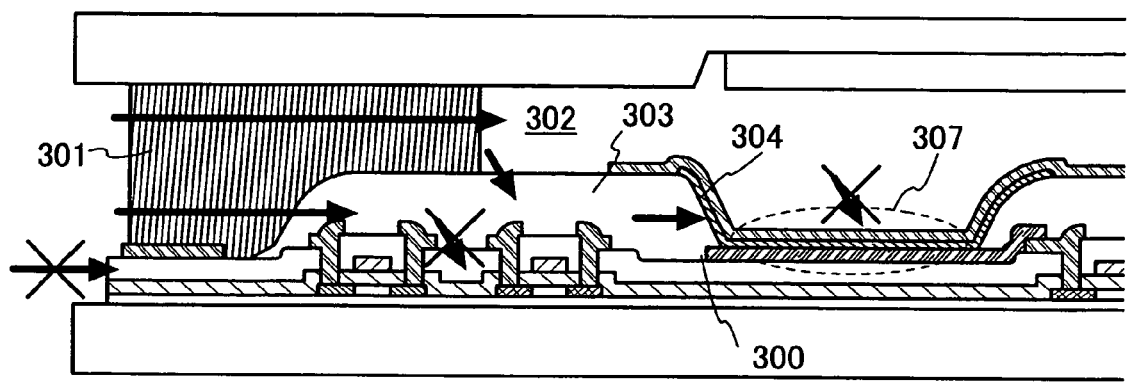
FIG. 2A is a cross sectional view of a conventional light emitting device.
Figure 2B:
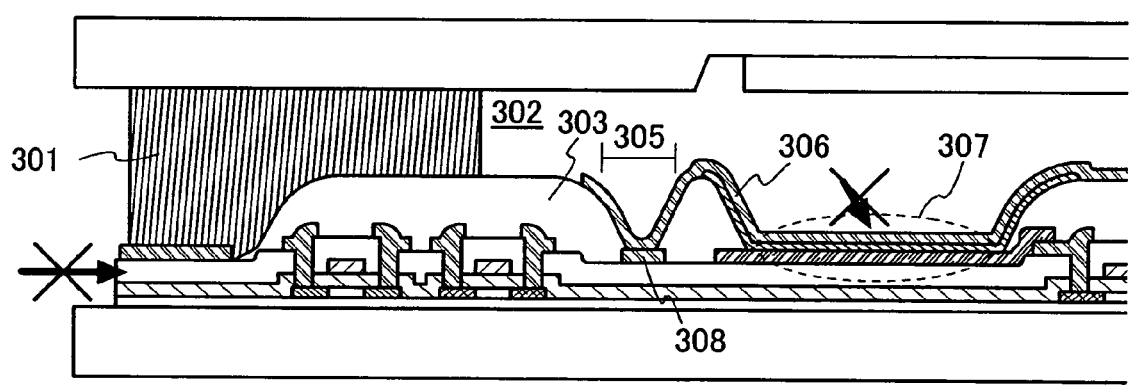
FIG. 2B is a cross sectional view of light emitting device according to the present invention.

FIG. 2B show examples in which an interlayer insulating film 300 is formed of a material such as silicon oxide, silicon nitride, silicon oxide containing nitrogen and silicon nitride containing oxygen. The interlayer insulating film 300 may include a single layer or lamination layer. Since these materials have a low water permeability and are hardly permeated with moisture if they are exposed to outside air, moisture hardly permeate through the interlayer insulating film 300 without covering the edge of the interlayer insulating film with a film 134 having a low water permeability as shown in FIG. 1A. In addition, the structure corresponding to the insulating film 109 as shown in FIG. 1A may not be provided. Note that other structure is same as that of Embodiment Mode 1, and will not be further explained.

FIG. 2A shows a conventional structure as a comparative example. Although moisture intruding through the interlayer insulating film 300 can be ignored, moisture penetrating through a sealing material 301 intrudes into an internal atmosphere 302 and a partition wall 303. Moisture intruding into the partition wall 303 reaches a light emitting film 304, thereby deteriorating a light emitting element 307.

FIG. 2B is a cross sectional view of a light emitting device applied with the present invention. In FIG. 2B, an opening 305 reaching an underlying layer is formed in the partition wall 303 and the inner face and the bottom face of the opening 305 are covered with a second electrode 306. Since the second electrode 306 has a low water permeability, moisture penetrating through the partition wall 303 cannot reach the light emitting film 304. Additionally, pinhole is not generated in the second electrode 121. According to the present invention, moisture that deteriorates the light emitting film 304 can be blocked, thereby preventing deterioration of the light emitting film 304.

Note that an insulating film made from another material may be formed between the interlayer insulating film 300 and the gate electrode or the gate insulating film. In this case, however, it is necessary that the insulating film have the low water permeability like the interlayer insulating film 300.

Note that a contact portion 308 has a same function as the contact portion 130 in FIG. 1A and may not be provided as well as the contact portion 130.

Embodiment Mode 3

Figure 3:
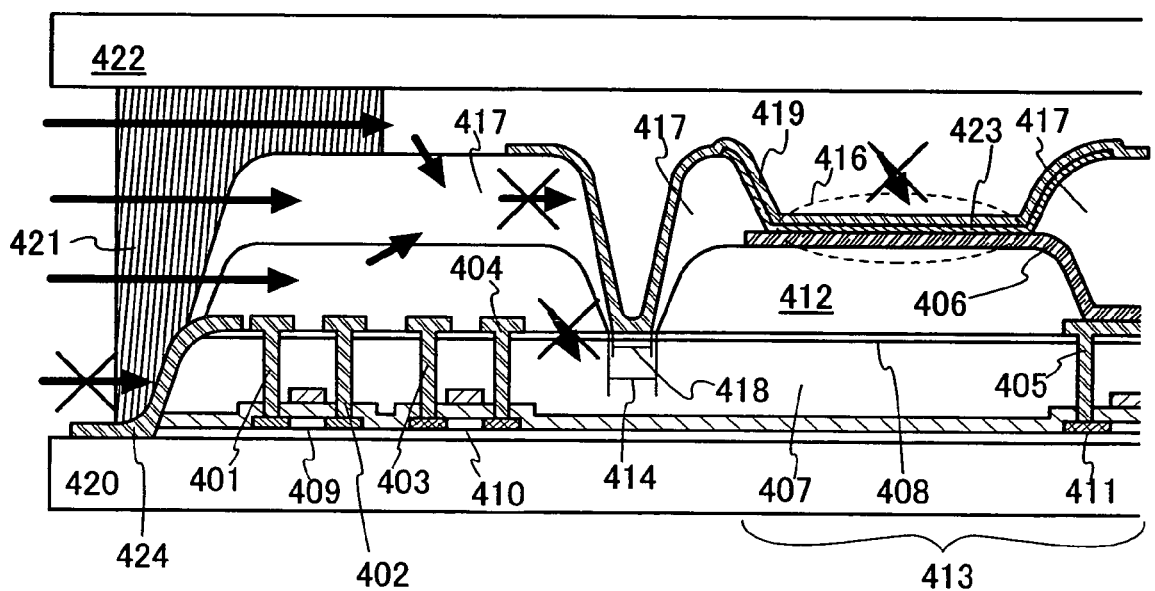
FIG. 3 is a cross sectional view of a light emitting device according to the invention.

Another embodiment mode of the present invention will be described with reference to FIG. 3. The portions identical with those in FIG. 1A to 1C may not be further explained.

In this embodiment mode, an example in which wirings 401 to 405 and a pixel electrode (a first electrode) 406 are located in different layers from one another will be explained. An insulating film 408 is formed on a first interlayer insulating film 407 in this embodiment mode. It is assumed that the first interlayer insulating film 407 is made from an organic insulating film such as acrylic and polyimide or an insulating film with a relatively high water permeability such as siloxane. Further, the insulating film 408 is made from a material with a low water permeability such as silicon nitride, silicon nitride containing oxygen, silicon oxide containing nitrogen and silicon oxide.

Note that one or more insulating films may be further provided between the first interlayer insulating film 407 and the gate electrode or the gate insulating film.

Electrodes (wirings) 401 to 405 are formed on the insulating film 408 to be electrically connected to semiconductor layers 409 to 411 through contact holes that are formed in the insulating film 408 and the first interlayer insulating film 407.

The insulating film 408 and the electrodes (wirings) 401 to 405 are covered with a second interlayer insulating film 412. A contact hole that reaches the electrode 405 of a thin film transistor in a pixel portion 413 and a first opening 414 that is provided around the circumference of the pixel portion are formed in the second interlayer insulating film 412. The first opening 414 passes through the second interlayer insulating film. When a driver circuit portion 425 and the pixel portion 413 are formed over the same substrate as well as the present embodiment mode, the first opening 414 is formed between the driver circuit portion 425 and the pixel portion 413. It is a matter of course that the present invention is applicable to a light emitting device in which a driver circuit is not integrally formed over the same substrate as a pixel portion.

A first electrode 406 of a light emitting element 416 is formed on the second interlayer insulating film 412 such that the first electrode is electrically connected to the electrode 405 of a thin film transistor through the contact hole formed in the second interlayer insulating film 412.

A partition wall 417 is formed on the second interlayer insulating film 412 so as to cover the contact hole and the edge of the first electrode 406. A second opening 418 is formed in the partition wall 417 at a position corresponding to the first opening 414 that is formed in the second interlayer insulating film 412. In other words, the first opening 414 overlaps the second opening 418. The bottom face of the second opening 418 is formed inside of the first opening 414 and reaches the insulating film 408. The second opening 418 is formed to surround the circumference of the pixel portion 413 as well as the first opening.

Preferably, the edge of the partition wall 417 facing the first electrode 406 comprises a curvature and has a tapered shape such that the curvature is continuously varied. A light emitting film 423 is formed to cover a part of the partition wall 417 and the first electrode 406. A second electrode 419 is formed to cover a part of the partition wall 417 and the light emitting film 423. The second electrode 419 covers the inner face and the bottom face of the second opening 418 that is formed in the partition wall 417.

An organic insulating film such as acrylic and polyimide, siloxane or the like is employed as materials for the second interlayer insulating film and the partition wall. It is known that these materials have relatively high water permeabilities. Therefore, it is assumed that moisture penetrating from the outside through a sealing film reaches the light emitting film 423 through the second interlayer insulating film and the partition wall. In the light emitting device having the structure of the present invention, however, penetration paths through which moisture intruding from the outside reaches the light emitting film 423 are cut off by the second electrode 419 formed so as to cover the side face and the bottom face of the first opening 414 formed in the first interlayer insulating film 407 and the second opening 418 formed in the partition wall 417.

The substrate 420 over which the elements are formed is firmly attached to a counter substrate 422 with a sealing material 421, thereby completing a light emitting device.

According to the above structure, deterioration of the light emitting film 423 due to moisture intruding from the outside can be reduced in the case where the first electrode 406 of the light emitting element and the wirings 401 to 405 are formed in the different layers. That is, a light emitting device having the above structure includes two interlayer insulating films. Consequently, the life of the light emitting element 416 can be prolonged, thereby improving the reliability of the light emitting device. That is, the light emitting device of the present invention comprises a structure in which the paths of moisture that penetrates through the sealing material 421 from the outside atmosphere are cut off.

The penetration paths of moisture are briefly described. At first, moisture penetrating through the first interlayer insulating film 407 cannot intrude into the light emitting film 423 side due to the existence of the insulating film 408. Also, when the peripheral edge portion of the first interlayer insulating film 407 is covered with a film 424 with a low water permeability as shown in FIG. 3, the absolute amount of moisture intruding into the first interlayer insulating film 407 itself can be reduced effectively.

Subsequently, moisture penetrating through the sealing material 421 into the second interlayer insulating film 412 and the partition wall 417 hardly intrudes into the light emitting film 423 side any more due to the first opening 414, the second opening 418 and the second electrode 419 that covers the side face and the bottom face of the second opening.

The second electrode 419 formed on the bottom face of the second opening 418 is in contact with the insulating film 408 and hinders the penetration of moisture.

Although the second electrode 419 formed on the bottom face of the second opening 418 is in contact with the insulating film 408, a contact portion may be made from the same material as the wirings 401 to 405 like the structure (the contact portion 130 in FIG. 1A) as depicted in Embodiment Mode 1.

Embodiment Mode 4

Another embodiment mode of the invention will be described with reference to FIGS. 4A and 4B. Note that portions identical to those in FIGS. 1A to 1C and FIG. 3 will not be further explained.

In this embodiment mode, an example in which wirings 501 to 505 and a pixel electrode (a first electrode) 506 are formed in different layers is explained. The embodiment mode shows an example in which a first interlayer insulating film 507 is made from any of silicon oxide, silicon nitride, silicon oxide containing nitrogen, silicon nitride containing oxygen and the like. The first interlayer insulating film 507 may include a single layer or lamination layer. Since these materials have low water permeabilities, if a peripheral portion of the first interlayer insulating film 507 is exposed to outside air, moisture hardly penetrates thereinto. Accordingly, the first interlayer insulating film 507 is hardly permeated with moisture without covering the edge of the first interlayer insulating film with a film having a low water permeability as shown in FIG. 3. Also, the structure corresponding to the insulating film 408 as shown in FIG. 3 may not be provided. The other structure is identical with that of Embodiment Mode 3.

Figure 4A:
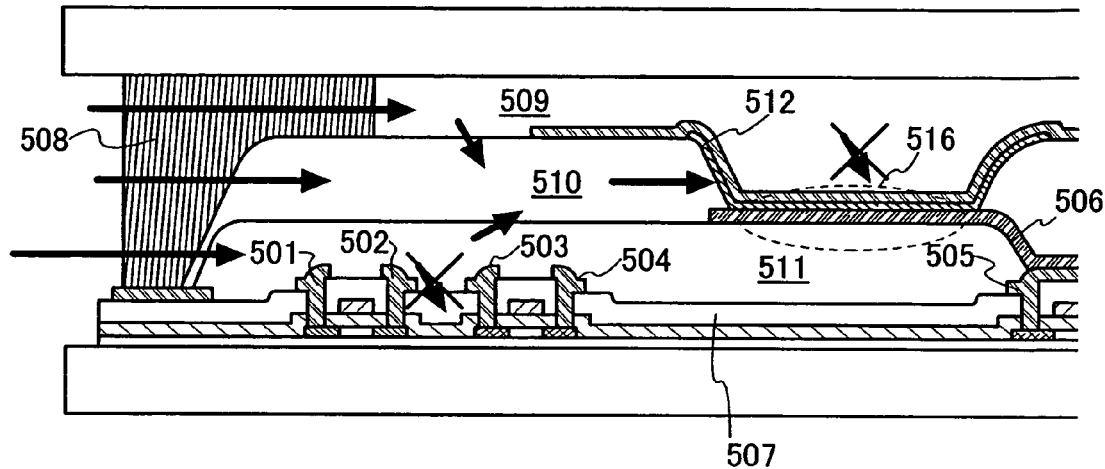
FIG. 4A is a cross sectional view of a conventional light emitting device according to the invention.

FIG. 4A is a cross sectional view of a conventional light emitting device. In the conventional structure, moisture penetrating through a sealing material 508 form the outside reaches a light emitting film 512 through a partition wall 510 by migrating through an internal atmosphere 509, the partition wall 510 and a second interlayer insulating film 511. This causes deterioration of the light emitting film 512. Meanwhile, in the present embodiment mode, since the first interlayer insulating film 507 is made from the material with the low water permeability as a prerequisite, moisture penetrating through the first interlayer insulating film 507 can be ignored.

Figure 4B:
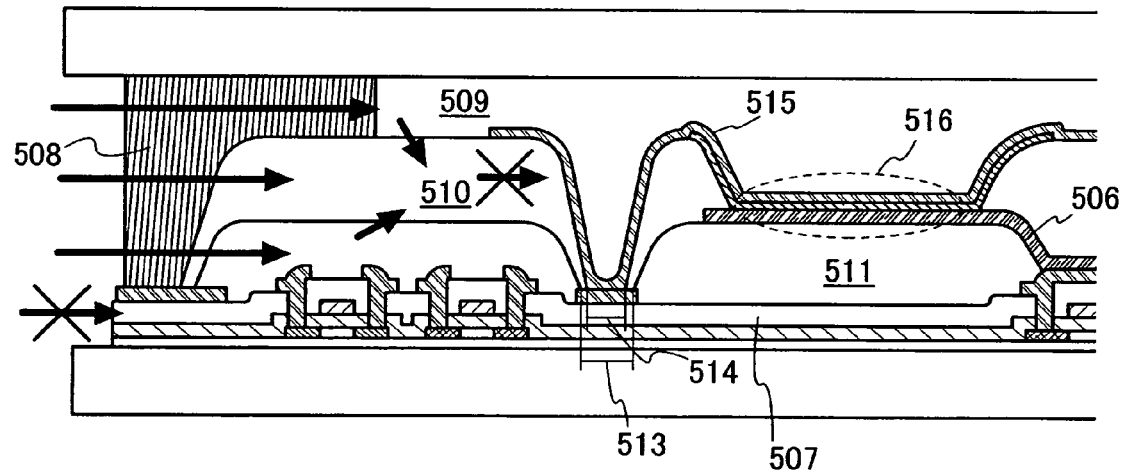
FIG. 4B is a cross sectional view of light emitting devices according to the invention.

On the other hand, FIG. 4B is a cross sectional view of a light emitting device according to the present invention. In FIG. 4B, a first opening 513 and a second opening 514 are formed in the second interlayer insulating film 511 and the partition wall 510 made from a material with a high water permeability, respectively. The side face and the bottom face of the second opening 514 are covered with a second electrode 515 of a light emitting element 516. The first opening 513 and the second opening 514 are both formed around a pixel portion so that the paths through which moisture penetrating from the outside reaches a light emitting film 512 through the second interlayer insulating film 511 and the partition wall 510 are cut off.

According to the structure, ingress of moisture from the outside can be inhibited. Since the deterioration of the light emitting film 512 can be reduced, the life of the light emitting element 516 can be prolonged, thereby increasing the reliability of the light emitting device.

Embodiment Mode 5

Another embodiment mode of the invention will be described with reference to FIGS. 5A and 5B. Note that portions identical to those in FIGS. 1A to 1C and FIG. 3 may not be further explained.

This embodiment mode includes a similar structure to those of FIGS. 1A to 1C or FIG. 3. A structure in which an insulating film with a low water permeability is not formed on an interlayer insulating film 600 will be described with reference to FIGS. 5A and 5B and FIGS. 7A and 7B.

In the structure in FIG. 5A, light emitting film 607 is formed over an interlayer insulating film 600. An opening 602 is formed around a pixel portion 603 in a partition wall 601 and the side face and the bottom face of the opening 602 are covered with a second electrode 605. Thereby, an invasion of moisture can be prevented.

In the structure of FIG. 5B, an opening 610 is formed in the interlayer insulating film 600, the gate insulating film, the base insulating film and the like between a lead wiring 608 and a driver circuit portion 609. The side face and the bottom face of the opening 610 are covered with a film 611 with a low water permeability. Further, the edge of the second electrode 605 for the light emitting element 604 is formed to be in contact with the film 611 with a low water permeability so that moisture penetrating from the outside through the sealing material 606 can be prevented from intruding into the interlayer insulating film 600 and the partition wall 601. Note that when the film 611 with the low water permeability is made from the same material as wirings or electrodes 612 to 616 of thin film transistors formed in the pixel portion 603 or the driver circuit portion 609 and they are processed at once, the number of steps can be reduced.

Figure 15:
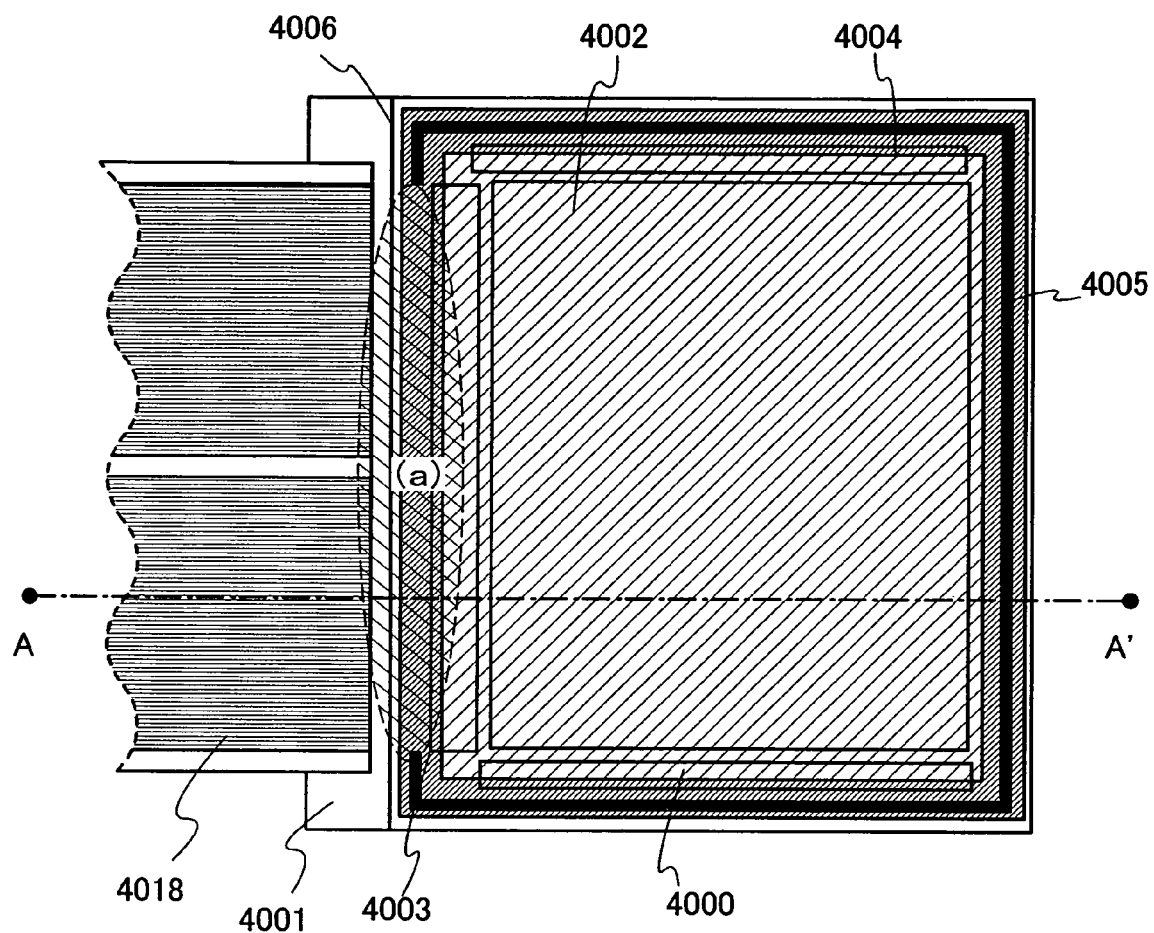
FIG. 15 is a top view of a light emitting device of the invention.

Note that since the opening 610 formed in the interlayer insulating film 600 is positioned outside of the driver circuit portion in this embodiment mode, which receives a signal from the outside, and therefore, the opening 610 can not be provided in a wiring lead portion ((a)region of FIG. 15), which receives a signal from the out side as shown in FIG. 15. However, the reliability against moisture can be improved even with this structure.

Figure 7A:
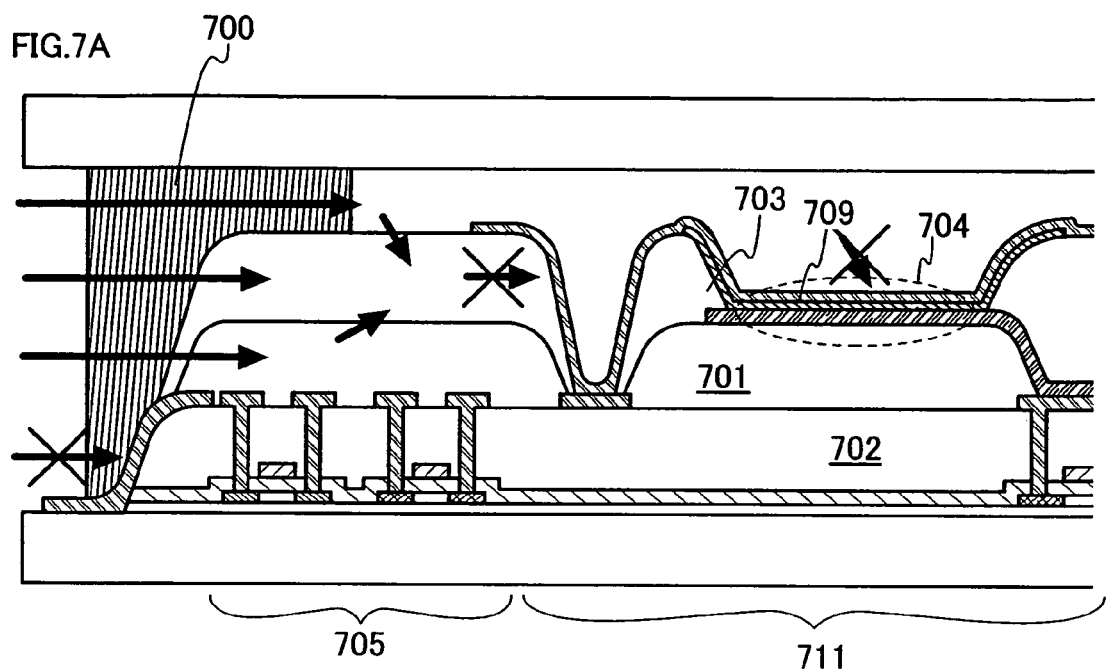
FIGS. 7A and 7B are cross sectional views of light emitting devices.

In the structure in FIG. 7A, light emitting film 704 is formed over an interlayer insulating film 701. An opening is formed around a pixel portion in a partition wall 703 and the side face and the bottom face of the opening are covered with a second electrode. Thereby, an invasion of moisture can be prevented.

Figure 7B:
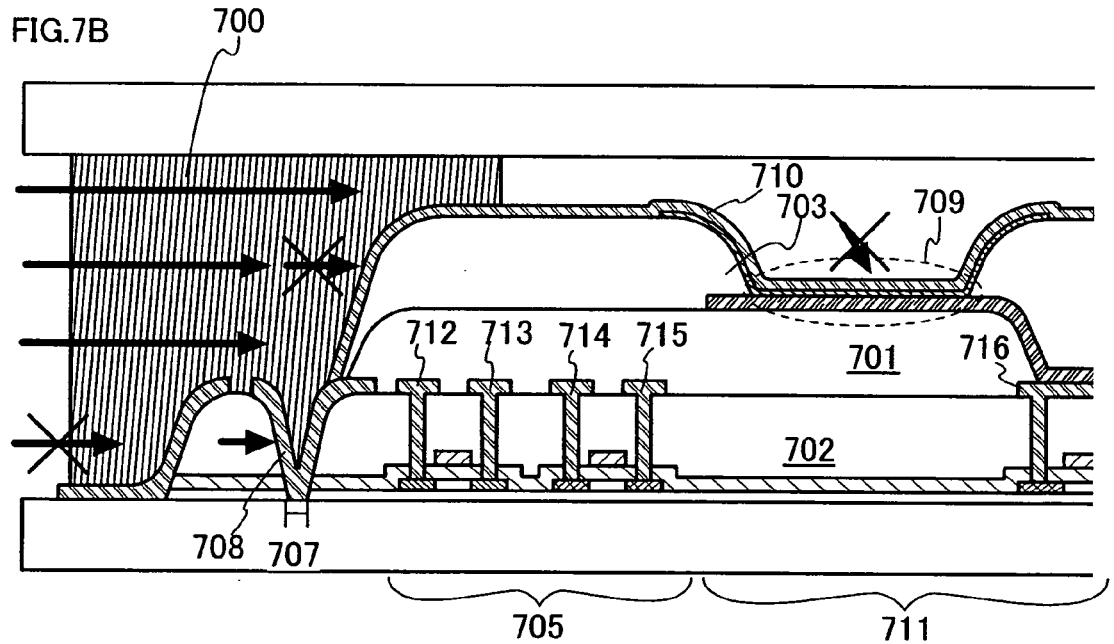

In such the structure, an opening 707 is formed in the first interlayer insulating film 702, the gate insulating film, the base insulating film and the like in the peripheral portion of the driver circuit portion 705 and the side face and the bottom face of the opening 707 are covered with a film 708 with a low water permeability in the same manner of the present embodiment mode as shown in FIG. 7B. Further, by forming the edge of the second electrode 710 for the light emitting element 709 to be in contact with the film 708 with the low water permeability, moisture intruding from the outside through the sealing material 700 can be prevented from penetrating into the first interlayer insulating film 702, the second interlayer insulating film 701 and the partition wall 703. Preferably, the film 708 with the low water permeability is made from the same material as those of the wirings or electrodes 712 to 716 of the thin film transistors formed in the pixel portion 711 or the driver circuit portion 705 to be formed together such that the number of steps is not increased.

Note that although the opening 707 is, herein, formed in the first interlayer insulating film 702 so as to inhibit the ingress of moisture into the first interlayer insulating film, the opening cannot be formed in the wiring lead portion ((a) region of FIG. 15) in which wirings are densely formed over and under the first interlayer insulating film 702 since the first interlayer insulating film 702 cannot be removed in order to prevent short-circuiting between the upper and lower wirings. Accordingly, the opening 707 cannot surround the pixel portion 711 completely. However, the effect of the present invention can be expected as the opening can be formed in at least the other portion.

Embodiment Mode 6

Figure 14:
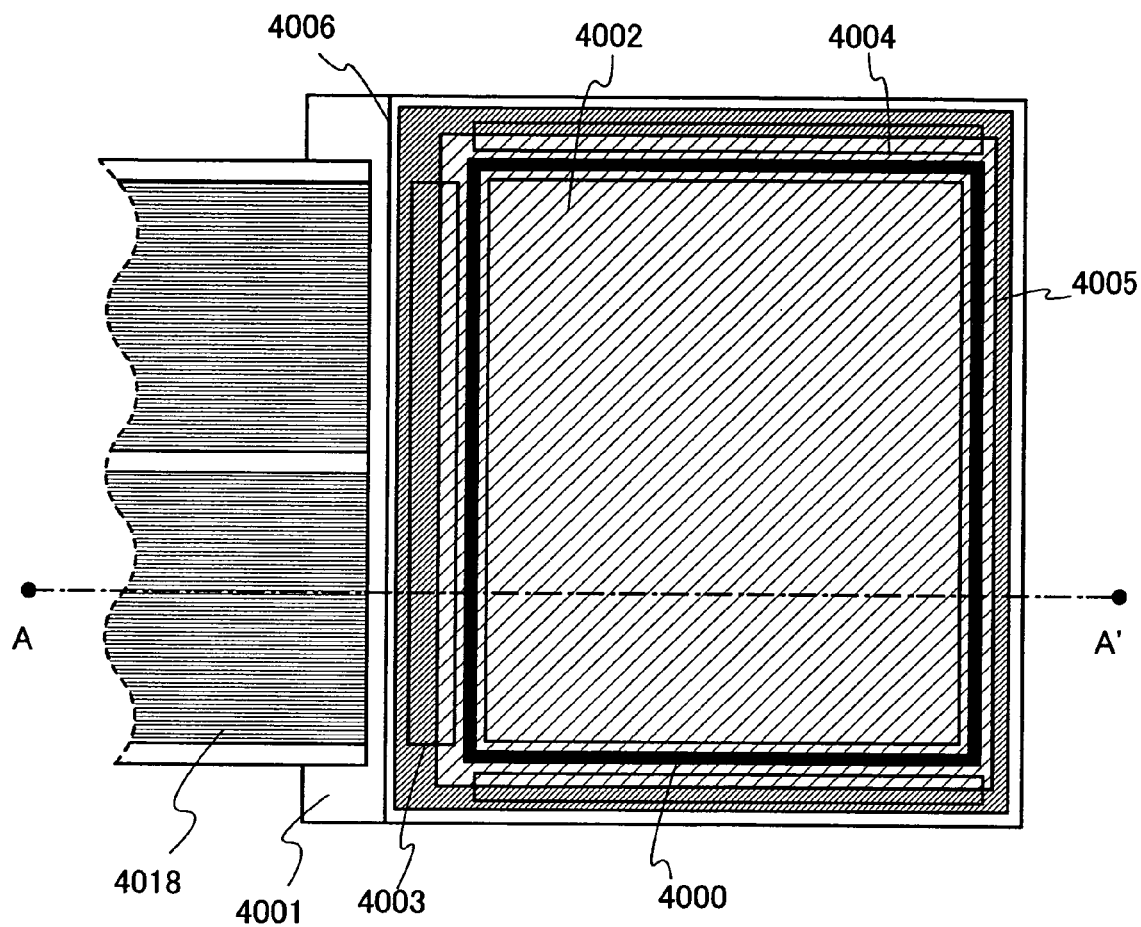
FIG. 14 is a top view of a light emitting device of the invention.

The present embodiment mode will describe an example of an exterior view of a light emitting device panel corresponding to one mode of the invention with reference to FIG. 14. FIG. 14 is a top view of a panel in which a transistor and a light emitting element formed over a substrate are sealed with a sealing material between a counter substrate 4006 and the substrate. FIG. 14 comprises any one of structures of Embodiment Modes 1 to 5.

A sealing material 4005 is formed to surround a pixel portion 4002, a signal line driver circuit 4003 and a scanning line driver circuit 4004 that are formed over a substrate 4001. The counter substrate 4006 is formed over the pixel portion 4002, the signal line driver circuit 4003 and the scanning line driver circuit 4004. Accordingly, the pixel portion 4002, the signal line driver circuit 4003 and the scanning line driver circuit 4004 along with filler are hermetically sealed with the substrate 4001, the sealing material 4005 and the counter substrate 4006. An opening 4000 is formed between the signal line driver circuit 4003, the scanning line driver circuit 4004 and the pixel portion 4002, wherein the side face and the bottom face of the opening are covered with a second electrode.

The pixel portion 4002, the signal line driver circuit 4003 and the scanning line driver circuit 4004 formed over the substrate 4001 comprise plural thin film transistors.

A lead wiring corresponds to a wiring for supplying a signal or a power supply voltage to the pixel portion 4002, the signal line driver circuit 4003 and the scanning line driver circuit 4004. The lead wiring is connected to a connection terminal and the connection terminal is electrically connected to a terminal of a flexible printed circuit (FPC) 4018 through an anisotropic conductive film.

As the filler, an inert gas such as nitrogen and argon, an ultraviolet curing adhesive agent and a thermal curing adhesive agent can be employed. Further, polyvinyl chloride, acrylic, polyimide, epoxy resin, silicon resin, polyvinyl butyral or ethylene vinylene acetate can be used.

FIG. 15 shows a case in which the opening 4000 is formed outside of the signal line driver circuit 4003 and the scanning line driver circuit 4004 as shown in Embodiment Mode 5. As has been described in Embodiment Mode 5, if the opening 4000 is formed in the lead wiring portion ((a) region of FIG. 15), which receives signals from the outside, the wirings are short-circuited in such the structure. Although the opening 4000 cannot surround the pixel portion 4002 completely, the present invention can be effective at least in portions other than the pixel portion.

Note that the display device of the invention includes a panel over which a pixel portion having a light emitting element is formed and a module in which an IC is mounted on the panel in its category.

Embodiment Mode 7

Various kinds of electronic appliances of the present invention mounted with a module like the example as shown in Embodiment Mode 6 include a camera such as a video camera and a digital camera, a goggle type display (a head-mounted display), a navigation system, an audio reproduction device (such as a car audio component system), a personal computer, a game machine, a portable information terminal (such as a mobile computer, a cellular telephone, a portable game machine and an electronic book), an image reproduction device provided with a recording medium (typically, a device which can reproduce the recording medium such as a digital versatile disc (DVD) and display images thereof), and the like. Specific examples of these electronic appliances are shown in FIGS. 16A to 16E.

FIG. 16A is a light emitting device such as a television, comprising a housing 2001, a display portion 2003, speaker portions 2004 and the like. In the light emitting device of the present invention, deterioration of a light emitting element in the display portion 2003 is suppressed, thereby increasing the reliability. In order to increase the contrast, a pixel portion may comprise a polarizing plate or a circular polarizing plate. For example, a film is preferably formed on a sealing substrate by sequentially laminating a ¼λ plate, a ½λ plate and a polarizing plate. In addition, an antireflection film may be provided on the polarizing plate.

FIG. 16B shows a cellular phone, comprising a main body 2101, a housing 2102, a display portion 2103, an audio input portion 2104, an audio output portion 2105, operational keys 2106, an antenna 2108 and the like. Deterioration of a light emitting element in the display portion 2103 is suppressed in the cellular phone according to the invention, thereby increasing the reliability.

FIG. 16C shows a personal laptop computer, comprising a main body 2201, a housing 2202, a display portion 2203, a keyboard 2204, an external connection port 2205, a pointing mouse 2206 and the like. Deterioration of a light emitting element in the display portion 2203 is suppressed in the laptop personal computer according to the invention, which results in improvement of reliability.

FIG. 16D shows a mobile computer, comprising a main body 2301, a display portion 2302, a switch 2303, operational keys 2304, an infrared port 2305 and the like. Deterioration of a light emitting element in the display portion 2302 is suppressed in the mobile computer according to the invention, which results in improvement of reliability.

FIG. 16E shows a portable gate machine, comprising a housing 2401, a display portion 2402, speaker portions 2403, operational keys 2404, a recording medium insert portion 2405 and the like. Deterioration of a light emitting element in the display portion 2402 is suppressed in the portable gate machine according to the invention, which results in improvement of reliability.

As set forth above, the application range of the present invention is extremely wide and the invention can be applied to electronic appliances in various fields.

Embodiment 1

A method for manufacturing a light emitting device according to the invention will be described with reference to FIGS. 8A to 8D and FIGS. 9A to 9C.

Figure 8A:
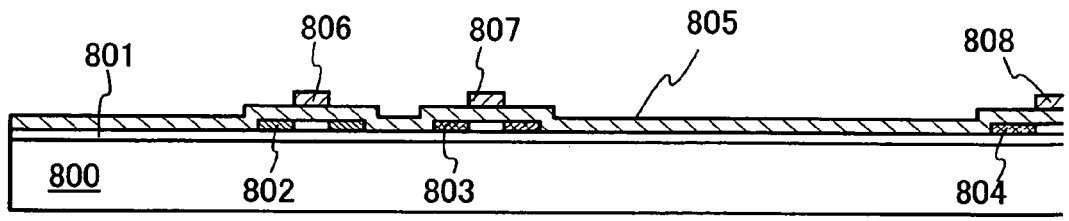
FIGS. 8A to 8D are cross sectional views explaining process of manufacturing a light emitting device of the invention.

After forming an insulating layer 801 on a substrate 800, a semiconductor layer is formed on the insulating layer 801 (FIG. 8A).

As a material for the substrate 800, a light transmitting glass, quartz, plastic (polyimide, acrylic, polyethylene terephthalate, polycarbonate, polyacrylate, polyethersulfone) or the like can be employed. These substrates can be used by being polished by CMP etc., if required. The present embodiment employs a glass substrate.

The insulating layer 801 is provided to prevent an element such as alkali metal and alkali earth metal included in the substrate 800, which adversely affects the characteristics of the semiconductor film, from dispersing into the semiconductor layer. As a material of the insulating layer 801, silicon oxide, silicon nitride, silicon oxide containing nitrogen, silicon nitride containing oxygen and the like can be used. The insulating layer may has a single layer or a lamination layer. If the dispersion of alkali metal and alkali earth metal is of no matter, the insulating film 801 is not particularly required to be formed.

The semiconductor layer is obtained by crystallizing an amorphous silicon film with laser beam in this embodiment. An amorphous silicon film is formed with a thickness of 25 to 100 nm (preferably, 30 to 60 nm) on the insulating layer 801. As a fabrication method, a known method such as sputtering, reduced pressure CVD and plasma CVD can be employed. Thereafter, the amorphous silicon film is subjected to heat treatment at 500° C. for one hour so as to perform dehydrogenation.

Subsequently, the amorphous silicon film is crystallized by using a laser irradiation apparatus to form a crystalline silicon film. An excimer laser is used for the laser crystallization in this embodiment. A laser beam oscillated from the excimer laser is processed into a linear beam spot by using an optical system so as to irradiate the amorphous silicon film, and hence, the crystalline silicon film is obtained and used as the semiconductor layer.

As another methods for crystallizing the amorphous silicon film, there are one in which crystallization is performed by only heat treatment and one in which crystallization is formed by heat treatment with use of a catalytic element that promotes crystallization. With respect to the element for promoting crystallization, nickel, steel, palladium, tin, lead, cobalt, platinum, copper, gold and the like can be cited. As compared with the case of performing crystallization only by heat treatment, crystallization can be carried out at a lower temperature and shorter times by using the element for promoting crystallization, and therefore, the glass substrate and the like are hardly damaged. When crystallization is performed only by heat treatment, a heat-resistant quartz substrate must be used as the substrate 800.

A minute amount of impurity is added to the semiconductor layer (i.e., so-called channel doping is performed) to control the threshold value, if necessary. To obtain a predetermined threshold value, an impurity (such as phosphorus and boron) imparting n-type or p-type conductivity is added to the semiconductor layer by ion doping and the like.

Thereafter, the semiconductor layer is patterned into predetermined shapes as shown in FIG. 8A to obtain island-like semiconductor layers 802 to 804. Concretely, the semiconductor layer is patterned in the following manner. A photoresist is applied to the semiconductor layer, the semiconductor layer is exposed and baked in the predetermined patterns, a resist mask is formed on the semiconductor layer and then the semiconductor layer is etched by using the mask.

A gate insulating film 805 is formed so as to cover the island-like semiconductor layers 802 to 804. As the gate insulating film 805, an insulating film containing silicon is formed by plasma CVD or sputtering so as to have a thickness of 40 to 150 nm.

Gate electrodes 806 to 808 are formed on the gate insulating film 805. The gate electrodes 806 to 808 may be made from an element selected from Ta, W, Ti, Mo, Al, Cu, Cr and Nd, or an alloy material or a compound material containing the above-mentioned elements as its principal constituent. Alternatively, a semiconductor film typified by a polycrystalline silicon film doped with an impurity element such as phosphorus may be used. Or, AgPdCu alloy may be used.

Although the gate electrodes 806 to 808 are formed to have a single layer, they may include a lamination layer having two or more layers, e.g., tungsten for a lower layer and molybdenum for an upper layer. When forming gate electrodes with a lamination structure, the foregoing materials may be used. A combination of these materials may arbitrarily be selected.

The gate electrodes 806 to 808 are etched by utilizing a mask made from a photoresist.

Subsequently, a high concentration impurity is added to the island-like semiconductor layers 802 to 804 while utilizing the gate electrodes 806 to 808 as masks. Accordingly, thin film transistors comprising the semiconductor layers 802 to 804, the gate insulating film 805 and the gate electrode 806 to 808 are formed.

The step of manufacturing the thin film transistors is not particularly limited, and may be arbitrarily changed so as to fabricate transistors with a predetermined structure.

Although the present embodiment employs the top-gate thin film transistor using the crystalline silicon film that is crystallized by laser crystallization, a bottom-gate thin film transistor using an amorphous semiconductor film can be used for the pixel portion. In addition to silicon, silicon germanium can be used for the amorphous semiconductor film. When using silicon germanium, the concentration of germanium is preferably set to be about 0.01 to 4.5 atomic %.

Alternatively, a microcrystalline semiconductor film (i.e., semiamorphous semiconductor) in which 0.5 to 20 nm crystal grains can be observed in an amorphous semiconductor film may be employed. The fine crystals in which 0.5 to 20 nm crystal grains can be observed are also referred to as so-called microcrystals (μc).

The semiamorphous silicon (also denoted by SAS) that is a semiamorphous semiconductor can be formed by glow discharge decomposition with silicide gas. $SiH_4$ is the representative silicide gas, and $Si_2H_6$, $SiH_2Cl_2$, $SiHCl_3$, $SiCl_4$, $SiF_4$ and the like can be used, besides $SiH_4$. The SAS can be easily formed by diluting the silicide gas with hydrogen or a mixture of hydrogen and one or more rare gas elements selected from helium, argon, krypton and neon. The dilution ratio may be in the range of from 1:10 to 1:1,000. The reactive generation of a subject film due to the glow discharge decomposition may be performed at a pressure in the range of 0.1 Pa to 133 Pa. The high frequency power for glow discharge may be set to be in the range of 1 to 120 MHz, preferably in the range of 13 to 60 MHz. The substrate heating temperature may be set to 300° C. or less, preferably 100 to 250° C.

Raman spectrum of the thus-formed SAS is shifted to lower wavenumbers than 520 $cm^{-1}$. The diffraction peaks of (111) and (220), which are believed to be originated in a Si crystal lattice, are observed in the SAS by X-ray diffraction. Further, the SAS is added with hydrogen or halogen of at least 1 atomic% as a neutralizing agent for dangling bonds. As for impurity elements contained in the film, each concentration of impurities for atmospheric constituents such as oxygen, nitrogen and carbon is preferably set to be $1\times10^{20}$ $cm^{-1}$ or less. In particular, the oxygen concentration is set to be $5\times10^{19}/cm^3$ or less; more preferably, $1\times10^{19}/cm^3$ or less. The electric field effect mobility μ of the TFT using the SAS is in the range of 1 to 10 $cm^2/Vsec$. The SAS may be further crystallized by laser beam.

Figure 8B:
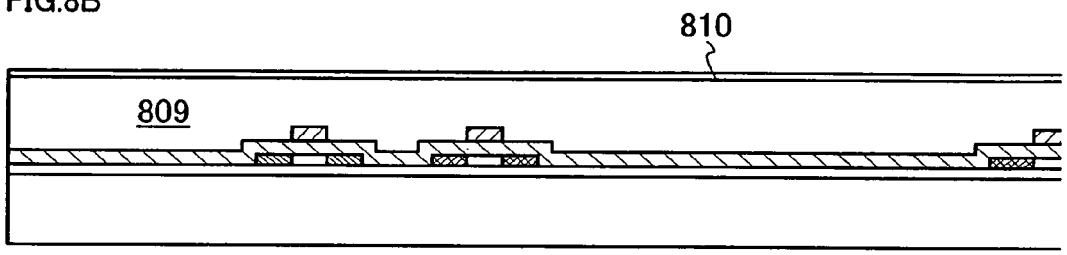

Subsequently, an interlayer insulating film 809 is formed to cover the gate electrodes 806 to 808 and the gate insulating film 805. As a material for forming the interlayer insulating film 809, a material in which the skeleton structure is formed by bonding oxygen with silicon oxide, acrylic, polyimide silicon siloxane a low-k material and the like may be employed. In this embodiment, the interlayer insulating film 809 is formed of siloxane (FIG. 8B).

Next, an insulating film 810 is made from a material with a low water permeability on the interlayer insulating film 809. Silicon nitride, silicon nitride containing oxygen, silicon oxide, silicon oxide containing nitrogen and the like may be used as the insulating film 810.

Figure 8C:
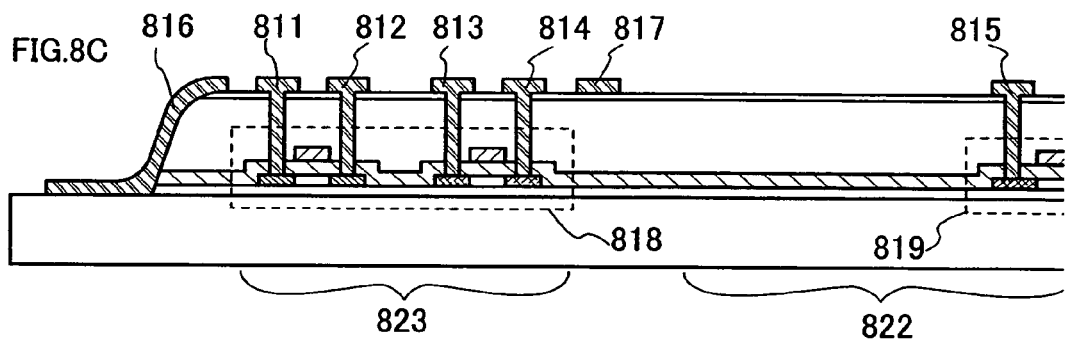

Contact holes are formed to pass through the insulating film 810, the interlayer insulating film 809 and the gate insulating film 805 and reach the semiconductor layers 802 to 804 while at least the insulating film 810, the interlayer insulating film 809 and the gate insulating film 805 in the periphery of the substrate are removed (FIG. 8C).

The formation of the contact holes and the removal of the insulating films in the periphery of the substrate may be performed by etching using a resist. Depending on the materials of the interlayer insulating film 809, the insulating film 810 and the gate electrodes 802 to 804, however, the contact holes may be formed by multiple types of etching by changing conditions of etching.

A conductive layer for covering the contact holes and the interlayer insulating film 809 is formed. The conductive layer is then processed into predetermined shapes to form wirings (electrodes) 811 to 815, a lead wiring 816 and a contact portion 817. Although the wirings, the lead wiring and the contact portion may be formed of a single layer of aluminum, copper or the like, they are formed to have a lamination structure that is formed by laminating molybdenum, aluminum and molybdenum in this order in the present embodiment. The wirings may have a lamination structure formed by sequentially titanium, aluminum and titanium or a lamination structure formed by sequentially titanium, titanium nitride, aluminum and titanium. The lead wiring 816 also serves as a cover film for covering the edge of the interlayer insulating film 809 and the like. The contact portion 817 is formed between a pixel portion 822 and a driver circuit portion 823 so as to surround the pixel portion 822.

Accordingly, the thin film transistor in the driver circuit portion and the thin film transistor in the pixel portion are completed, respectively. Reference numeral 818 represents a part of the thin film transistor in the driver circuit portion while reference numeral 819 represents a part of the thin film transistor in the pixel portion.

Figure 8D:
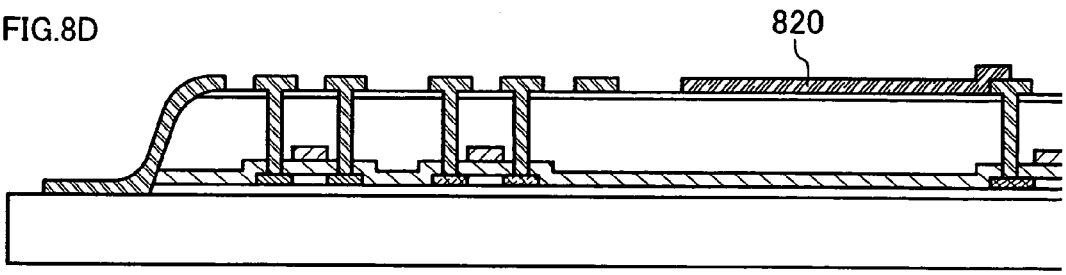

A transparent conductive layer is formed to cover the electrode 815 of the thin film transistor 819 in the pixel portion, and then the transparent conductive layer is processed to form a first electrode 820. The first electrode 820 is, herein, electrically connected to the electrode 815 of the thin film transistor 819. As a material for the first electrode 820, indium tin oxide (ITO), ITO containing silicon oxide, IZO (indium zinc oxide) in which 2 to 20% zinc oxide is added to indium oxide, zinc oxide, GZO (gallium zinc oxide) in which gallium is added to zinc oxide and the like may be used (FIG. 8D).

Figure 9A:
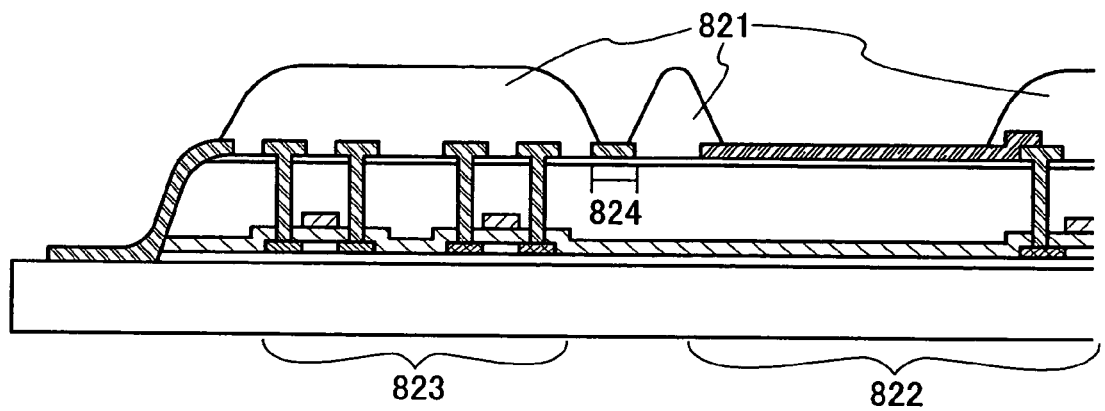
FIGS. 9A to 9C are cross sectional views explaining process of manufacturing a light emitting device of the invention.

Next, an insulating film made from an organic material or an inorganic material is formed to cover the insulating film 810 and the first electrode 820. Subsequently, the insulating film is processed such that the first electrode is partly exposed to form a partition wall 821. Although a photosensitive organic material (such as acrylic and polyimide) is preferably employed as a material of the partition wall 821, it may be made from a non-photosensitive organic material or an inorganic material. Preferably, the edge face of the partition wall 821 facing the first electrode comprises a curvature and has a tapered shape in which the curvature is continuously varied. Note that the partition wall 821 may be mixed with a black substance such as a pigment and carbon to be used as a black matrix (FIG. 9A).

An opening 824 is formed around the pixel portion 822 between the pixel portion 822 and the driver circuit portion 823. The opening 824 is formed in a portion corresponding to the contact portion 817 such that the contact portion 817 is exposed from the bottom face of the opening.

Figure 9B:
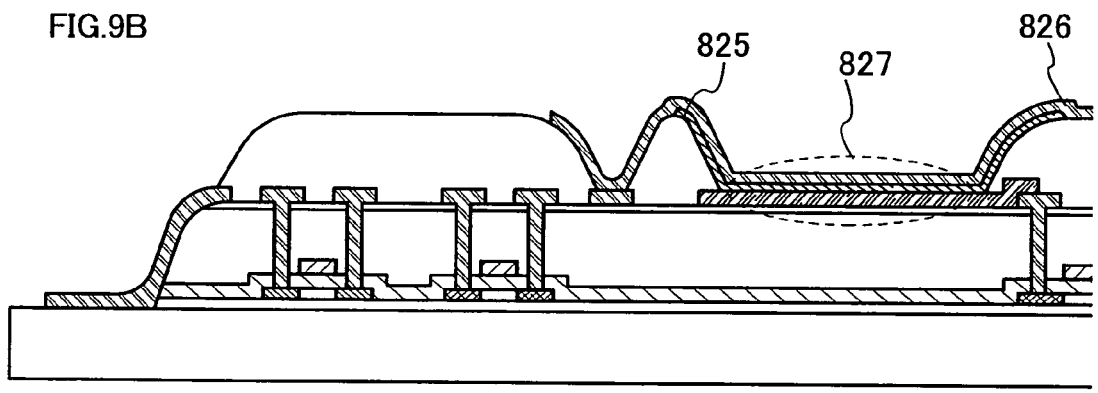
Figure 9C:
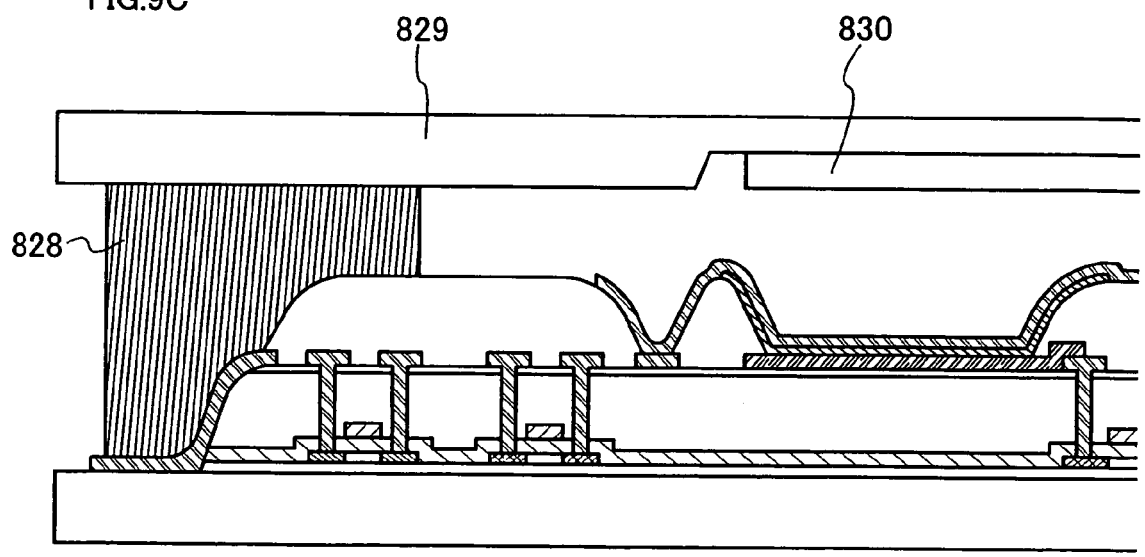

A light emitting film 825 is next formed to cover the first electrode 820 exposed from the partition wall 821. The light emitting film 825 may be formed by using any methods such as vapor deposition, ink jetting and spin coating (FIG. 9B).

A second electrode 826 is formed to cover the light emitting film 825. Accordingly, a light emitting element 827 comprising the first electrode 820, the light emitting film 825 and the second electrode 826 can be formed. The second electrode 826 is formed to cover the opening 824, i.e., the side face and the bottom face of the opening 824.

A silicon oxide film containing nitrogen may be formed by plasma CVD as a passivation film. When using a silicon oxide film containing nitrogen, a silicon oxynitride film made from $SiH_4$, $N_2O$ and $NH_3$, a silicon oxynitride film made from $SiH_4$ and $N_2O$ or a silicon oxynitride film made from a gas in which $SiH_4$ and $N_2O$ is diluted with Ar may be formed by plasma CVD.

Alternatively, a silicon hydrogenated oxynitride film made from $SiH_4$, $N_2O$ and $H_2$ may be employed as the passivation film. Of course, the passivation film is not limited to a single layer structure. The passivation film may include a lamination structure or a single layer structure that includes another layer containing silicon. In addition, a multilayer film of a carbon nitride film and a silicon nitride film, a multilayer film of styrene polymer, a silicon nitride film or a diamond-like-carbon film may be used instead of the silicon oxide film comprising nitrogen.

Subsequently, a display portion is sealed. When a counter substrate 829 is used to seal the display portion, the counter substrate is attached to the substrate 800 with an insulating sealing material 828 such that an external connection portion is exposed. A depression portion may be provided on the counter substrate 829 to which a drying agent 830 is formed. The space between the counter substrate 829 and the substrate 800 over which the elements are formed may be filled with an inert gas such as dry nitrogen, or the sealing material 828 may be applied over the entire surface of the pixel portion so as to form the counter substrate. As the sealing material, an ultraviolet curing resin or the like is preferably used. A drying agent or a particle for keeping a constant gap may be mixed into the sealing material. Subsequently, a flexible wiring substrate is attached to the external connection portion, which completes a light emitting device.

The light emitting device according to the present invention with a display function may employ either analog video signals or digital video signals. When using the digital video signals, light emitting devices are classified into one in which the video signals use a voltage and one in which the video signals use a current. When light emitting elements emit light, video signals input in pixels are classified into a constant voltage drive for controlling constant voltage applied to the light emitting elements and a constant current drive for controlling constant current flowing through the light emitting elements. The constant current drive can control such that constant current flows through the light emitting elements regardless of deterioration of the light emitting elements and change in value of resistance due to change in temperatures and the like. Either the constant voltage drive or the constant current drive may be applicable to the method for driving the light emitting device of the invention.

Note that a person who skilled in the art can easily obtain another configurations of the present invention as shown in FIG. 1B, FIG. 2B, FIG. 3B, FIG. 4B, FIG. 5B and FIG. 7B by arbitrarily changing the manufacturing process as described in the present embodiment.

Embodiment 2

Figure 17A:
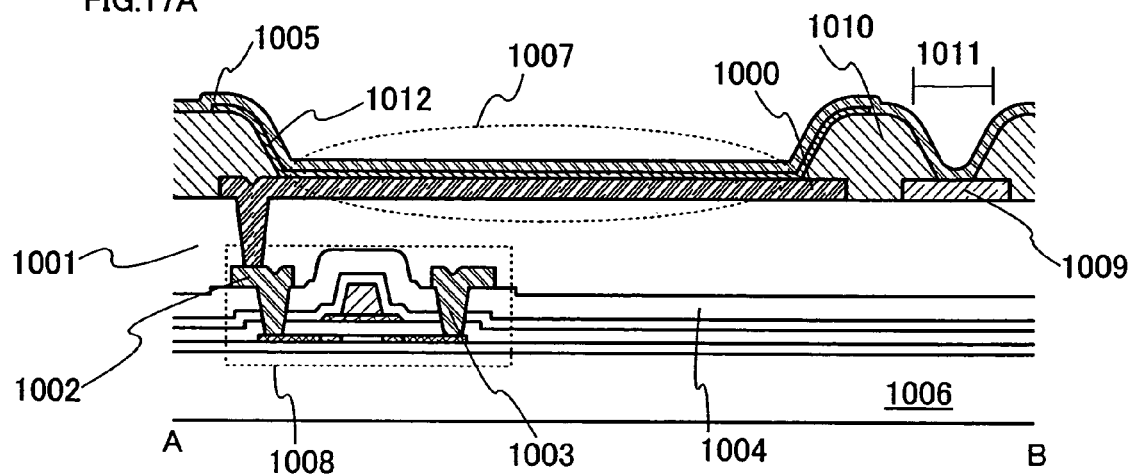
FIGS. 17A to 17C are examples of pixel structures.
Figure 17B:
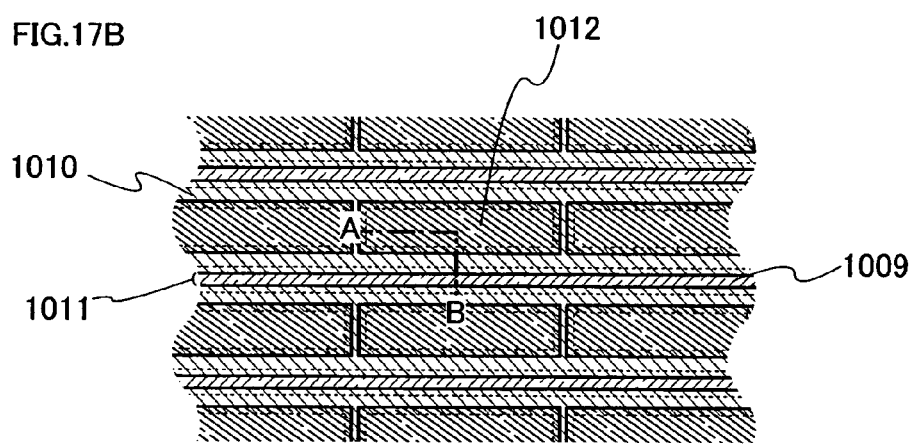

An example of a pixel structure will be described in the present embodiment with reference to FIGS. 17A and 17B. This embodiment shows a pixel structure in the case where a first electrode of a light emitting element and electrodes of a thin film transistor are formed in different layers as shown in FIG. 3, FIGS. 4A and 4B and FIGS. 7A and 7B. FIG. 17B is a top view according to the present embodiment while FIG. 17A is a cross sectional view taken along a line A-B of FIG. 17B. In FIG. 17B, reference numeral 1012 indicates a light emitting film; 1009, an auxiliary wiring; and 1010, a partition wall.

In this case, a first electrode 1000 is formed on a second interlayer insulating film 1001 whereas electrodes 1002 and 1003 of a thin film transistor are formed on a first interlayer insulating film 1004, and therefore, they are formed on the different layers. When the second electrode 1005 is made from a transparent conductive film and light is emitted toward a direction opposite to a substrate 1006 (i.e., top emission), a thin film transistor 1008 can be formed at a position overlapping with a light emitting element 1007. This is effective in relation to the aperture ratio.

In turn, although the second electrode 1005 is made from the transparent conductive film in this embodiment, the transparent conductive film usually has high resistivity. When the second electrode 1005 is formed to cover the entire surface of a pixel portion, since the transparent conductive film has high resistivity, display may be adversely affected in the peripheral portion and the central portion of the pixel portion due to decrease in voltage.

Therefore, an auxiliary wiring 1009 is formed by using a low resistive material in the same layer as the first electrode 1000 and the auxiliary wiring is connected to the second electrode 1005 made from a conductive film in the embodiment. The auxiliary wiring is formed in a stripe shape between pixels as shown in FIG. 17B and is connected to the second electrode 1005 of the light emitting element 1007 through the opening 1011 formed in the partition wall 1010. The auxiliary wiring is connected in such a manner in the entire of the pixel portion.

By providing the auxiliary wiring 1009, reduction in the apparent resistivity of the second electrode 1005 and reduction in voltage can be prevented, thereby performing favorable display in the entire pixel portion.

If such the auxiliary wiring 1009 is not formed in large areas of the pixel portion, the reduction in voltage cannot be inhibited. Also, if the auxiliary wiring 1009 does not have an adequate width, reduction in voltage is also caused in the auxiliary wiring in itself. Therefore, it is difficult to form the auxiliary wiring 1009 with an appropriate width that can function efficiently on the first interlayer insulating film of the lower layer. By providing the auxiliary wiring 1009 on the second interlayer insulating film 1001, however, the auxiliary wiring 1009 that can function effectively can be formed.

Note that the partition wall 1010 may be mixed with a black substance such as a pigment and carbon so as to be used as a black matrix.

Figure 17C:
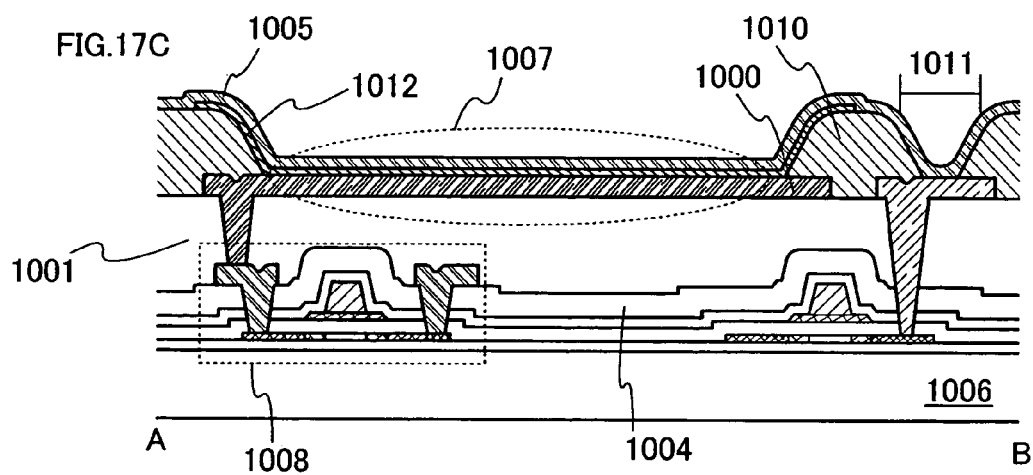

FIG. 17C shows another pattern of the present embodiment, wherein an auxiliary wiring also serves as an electrode of a thin film transistor.

Embodiment 3

The present embodiment will describe a structure of the light emitting film 825 in more detail.

The light emitting film includes a light emitting layer formed of an organic compound or an inorganic compound. The organic compound includes one or more of a low molecular weight organic compound, an intermediate molecular weight organic compound (which indicates an organic compound that does not sublimate and has 20 or less molecules or a chained molecule with a length of 10 μm or less) and a high molecular weight organic compound, depending on the number of its molecules. Also, the light emitting film may includes an electron injecting/transporting material or a hole injecting/transporting material in addition to the light emitting layer. The electron injecting/transporting material and the hole injecting/transporting material include an organic compound or an inorganic compound.

With respect to substances with excellent electron transporting properties among the charge injecting/transporting substances, for example, metal complexes having quinoline skeleton or benzoquinoline skeleton such as tris(8-quinolinolate)aluminum (abbreviation: $Alq_3$); tris(5-methyl-8-quinolinolate)aluminum (abbreviation: $Almq_3$); bis(10-hydroxybenzo[h]quinolinato)beryllium (abbreviation: $BeBq_2$); and bis(2-methyl-8-quinolinolate)-4-phenylphenolate-aluminum (abbreviation: BAlq) can be given. As substances having superior hole transporting properties, for example, the following substances can be cited: aromatic amine (i.e., one having a benzene ring-nitrogen bond) based compounds such as: 4,4'-bis[N-(1-naphthyl)-N-phenyl-amino]-biphenyl (abbreviation: α-NPD); 4,4'-bis[N-(3-methylphenyl)-N-phenyl-amino]-biphenyl (abbreviation: TPD); 4,4',4"-tris(N,N-diphenyl-amino)-triphenylamine (abbreviation: TDATA); and 4,4',4"-tris[N-(3-methylphenyl)-N-phenyl-amino]-triphenylamine (abbreviation: MTDATA).

With respect to substances having extremely superior electron injecting properties among the charge injecting/transporting substances, compounds of alkali metal or alkali earth metal such as lithium fluoride (LiF), cesium fluoride (CsF) and calcium fluoride ($CaF_2$) can be cited. In addition, a mixture of a substance having a high electron transportation property such as $Alq_3$ and alkali earth metal such as magnesium (Mg) may be used.

With respect to substances having extremely superior hole injecting properties among the charge injecting/transporting substances, for example, the following substances can be cited: metal oxide such as molybdenum oxide (MoOx), vanadium oxide (VOx), ruthenium oxide (RuOx), tungsten oxide (WOx) and manganese oxide (MnOx). Besides, phthalocyanine based compounds such as phthalocyanine (abbreviation: $H_2Pc$) and copper phthalocyanine (CuPc) can be mentioned.

Light emitting layers having different light-emitting wavelength bands may be formed in each pixel so as to perform color display. Typically, light emitting layers corresponding to respective colors of R (red), G (green) and B (blue) are formed. In this case, when a filter (a colored layer) that transmits lights of the wavelength bands is provided at a side of light emission of pixels, color purity can be improved and specular reflexion (reflection) of a pixel portion can be prevented. By providing the filter (colored layer), a circular polarizing plat etc., which has been used to prevent the specular reflexion (reflection) of the pixel portion, can be eliminated. Therefore, loss of light emitted by the pixel portion, in which the amount of the light has been approximately reduced by half, can be eliminated. Also, change in color tone, that is caused in the case where a pixel portion (a display screen) is seen obliquely, can be reduced.

There are various kinds of light emitting materials. With respect to low molecular weight organic light emitting materials, the following substances can be used: 4-dicyanomethylene-2-methyl-6-(1,1,7,7-tetramethyl-julolidyl-9-enyl)-4H-pyran (abbreviation: DCJT); 4-dicyanomethylene-2-t-butyl-6-(1,1,7,7-tetramethyl-julolidyl-9-enyl)-4H-pyran (abbreviation: DPA); periflanthene; 2,5-dicyano-1,4-bis(10-methoxy-1,1,7,7-tetramethyl-julolidyl-9-enyl)benzene, N,N'-dimethylquinacridone (abbreviation: DMQd); coumarin 6; coumarin 545T; tris(8-quinolinolate)aluminum (abbreviation: $Alq_3$); 9,9'-biantryl; 9,10-diphenylanthracene (abbreviation: DPA); 9,10-bis(2-naphthyl)anthracene (abbreviation: DNA); and the like. Also, another substances can be used.

On the other hand, as compared with the low molecular weight organic light emitting materials, the high molecular weight organic light emitting materials have higher physical strength, which results in more durable elements. In addition, since the high molecular weight organic light emitting materials can be formed by application, an element can be formed relatively easily. A structure of a light emitting element made from the high molecular weight organic light emitting material is basically similar to that of using the low molecular weight organic light emitting material, and is formed by sequentially laminating a cathode, an organic light emitting layer and an anode over a TFT side. However, when a light emitting layer is made from the high molecular weight organic light emitting material, it is difficult to form the lamination structure like the case of using the low molecular weight organic light emitting material. In many cases, such the light emitting element made from the high molecular weight organic light emitting material has a two layer structure. Concretely, it is a lamination structure formed by sequentially laminating a cathode, a light emitting layer, a hole transporting layer and an anode.

The luminescent color is determined by a material for forming a light emitting layer, and hence, a light emitting element that emits a predetermined color of light can be formed by selecting the material. As high molecular weight electroluminescent materials that can be used to form a light emitting layer, polyparaphenylene vinylenes, polyparaphenylenes, polythiophenes, polyfluorenes and the like can be mentioned.

Specifically, the following substances can be cited as polyparaphenylene vinylenes: derivatives of poly(paraphenylenevinylene) (PPV); poly(2,5-dialkoxy-1,4-phenyenevinylene) (RO-PPV); poly[2-(2'-ethylhexoxy)-5-methoxy-1,4-phenylenevinylene] (MEH-PPV); poly[2-dialkoxyphenyl]-1,4-phenylenevinylene] (ROPh-PPV); and the like. With respect to the polyparaphenylenes, the following substances can be cited: derivatives of polyparaphenylene (PPP); poly(2,5-dialkoxy-1,4-phenylene) (RO-PPP); poly(2,5-dihexoxy-1,4-phenylene); and the like. With respect to the polythiophenes, the following substances can be mentioned: derivatives of polythiophene (PT); poly(3-alkylthiophene) (PAT); poly(3-hexylthiophene) (PHT); poly(3-cyclohexylthiophene) (PCHT); poly(3-cyclohexyl-4-methylthiophene) (PCHMT); poly(3,4-dicyclohexylthiophene) (PDCHT); poly [3-(4-octylphenyl)-thiophene] (POPT); poly[3-(4-octylphenyl)-2,2-bithiophene] (PTOPT); and the like. With respect to the polyfluorenes, the following substances can be cited: derivatives of polyfluorenes (PF); poly(9,9-dialkylfluorene) (PDAF); poly(9,9-dioctylfluorene) (PDOF); and the like.

When a high molecular weight organic light emitting material with a hole transporting property is formed between an anode and a high molecular weight organic light emitting material with a light emitting property, the hole injecting property from the anode can be improved. Generally, a solution in which a high molecular weight organic light emitting material with the hole transporting property is dissolved in water along with an acceptor material is applied by spin coating or the like. Since an organic solvent is insoluble, it can be laminated along with the above-mentioned organic light emitting material with the light emitting property. As the high molecular weight organic light emitting material with the hole transporting property, a mixture of PEDOT and camphor sulfonic acid (CSA) as a acceptor material; a mixture of polyaniline (PANI) and polystyrenesulfonic acid (PSS) as a acceptor material; and the like can be cited.

A light emitting layer can emit monochromatic light or white light. In the case of using a white light emitting material, a color display can be achieved by providing a color filter (a colored layer) that transmits light of a certain wavelength toward a light emitting direction of a pixel.

In order to form a light emitting layer that emits white light, for example, white light emission can be achieved by sequentially laminating $Alq_3$, $Alq_3$ partially doped with Nile red, which is a red light emitting pigment, $Alq_3$, p-EtTAZ and TPD (aromatic diamine) by using vapor deposition. Also, when an EL is formed by application using spin coating, the EL is preferably baked by vacuum heating after application. For example, an aqueous solution of poly(ethylene dioxythiophene)/poly(styrenesulfonic acid) (PEDOT/PSS), which functions as a hole injecting layer, may be applied over the entire surface of the substrate and baked. Afterwards, a solution of polyvinyl carbazole (PVK) doped with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red and coumarin 6), which serves as a light-emitting layer, may then be applied over the entire surface and baked.

A light emitting layer may be formed to have a single layer. In this case, 1,3,4-oxadiazole derivative (PBD) with an electron transporting property may be dispersed in polyvinyl carbazole (PVK) with a hole transporting property. In addition, white light emission can be obtained by dispersing 30 wt % PBD as an electron transporting agent and dispersing a suitable amount of four kinds of pigments (TPB, coumarin 6, DCM1, and Nile red). In addition to the above-mentioned light emitting elements that emit white light, a light emitting element capable of emitting red light, green light or blue light can be manufactured by properly selecting materials for the light emitting layer.

When a high molecular weight organic light emitting material with a hole transporting property is formed between an anode and a high molecular weight organic light emitting material with a light emitting property, the hole injecting properties from the anode can be improved. Typically, a solution in which a high molecular weight organic light emitting material with the hole transporting property is dissolved in water along with an acceptor material is applied by spin coating or the like. Since an organic solvent is insoluble, it can be laminated along with the above-mentioned organic light emitting material with the light emitting property. As the high molecular weight organic light emitting material with the hole transporting property, a mixture of PEDOT and camphor sulfonic acid (CSA) as a acceptor material; a mixture of polyaniline (PANI) and polystyrenesulfonic acid (PSS) as a acceptor material; and the like can be cited.

Further, triplet excited light emitting materials comprising metal complexes and the like may be used for a light emitting layer in addition to singlet excited light emitting materials. For example, pixels emitting red light in which luminance half-life is relatively short are formed by a triplet excited light emitting material, and pixels emitting green and blue lights are formed of singlet excited light emitting materials. Since the triplet excited light emitting material has excellent light emitting efficiency, it has a feature of requiring low power consumption in order to obtain a same level of luminance as compared with the singlet excited light emitting material. That is, when the pixels for emitting red light are formed by a triplet excited light emitting material, a small amount of current flowing through the light emitting element is required, thereby improving the reliability. To reduce power consumption, pixels emitting red and green lights may be formed of the triplet excited light emitting materials, while pixels emitting blue light may be formed of a singlet excited light emitting material. In the case where light emitting elements that emit green lights, which has high visibility with respect to human eyes, are also formed of the triplet excited light emitting material, power consumption can be further reduced.

As an example of the triplet excited light emitting material, there is one that uses a metal complex as a dopant. In particular, a metal complex with platinum, which is a third transition element, as its central metal, a metal complex with iridium as its central metal and the like are known. The triplet excited light emitting materials are not limited to these compounds, and it is possible to use a compound having a above mentioned structure and comprising an element that belongs to groups 8 to 10 of the periodic table as its central metal.

Above mentioned substances for forming the light emitting layer are examples, and a light emitting element can be formed by properly laminating respective layers with various properties such as a hole injecting/transporting layer, a hole transporting layer, an electron injecting/transporting layer, an electron transporting layer, a light emitting layer, an electron blocking layer and a hole blocking layer. In addition, a mixed layer or a mixed junction of these layers may be used. The layer structure of the light emitting layer can be varied, and the light emitting layer can be formed in various forms. The structural changes in the light emitting layer may be allowable without deviating the purpose of the invention; for example, an electrode is provided or a light emitting material is dispersed so as to functions as a light emitting layer, instead of providing a certain electron injecting layer or light emitting region.

When a light emitting element formed of the above-mentioned materials is applied with a forward bias voltage, it can emit light. A pixel portion of a display device formed using the light emitting element can be driven by either a simple matrix method or an active matrix method. In either case, each pixel emits light by being applied with a forward bias voltage at a certain timing, whereas each pixel does not emit light in a certain period. In the non-light emitting period, a reverse bias voltage is applied to the light emitting element so that the reliability of the light emitting element can be improved. The light emitting element has deterioration modes of reducing light intensity under a certain drive condition or reducing appearance luminance due to expansion of a non-light emitting region within pixels. When the light emitting element is driven by AC drive such that each pixel is applied with a forward bias voltage and a reverse bias voltage alternately, the deteriorations of the light emitting element can be hindered, thereby increasing the reliability of the light emitting device.

Embodiment 4

A structure of a light emitting device according to the present invention will be described in this embodiment with reference to FIGS. 10A to 10C.

Figure 10A:
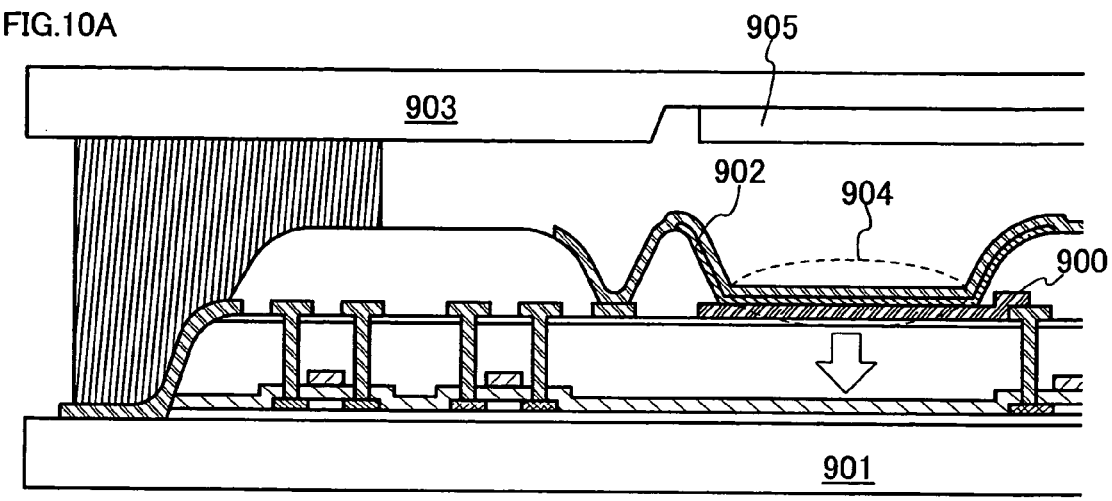
FIGS. 10A to 10C are cross sectional views of light emitting devices.

FIG. 10A shows a bottom emission structure in which a first electrode 900 is formed of a transparent conductive film and light generated in a light emitting layer 902 is emitted toward a substrate 901 side. Note that reference numeral 903 denotes a counter substrate and is firmly attached to the substrate 901 with a sealing material or the like after forming a light emitting element 904 over the substrate 901. A depression portion may be formed on the counter substrate 903 so as to form a drying agent 905 in the depression portion. Alternatively, a resin with a light transmitting property etc. is filled between the counter substrate 903 and the element to seal the element so that the light emitting element 904 can be prevented from being deteriorated due to moisture. Desirably, the rein has a hygroscopic property. In addition, when a drying agent with a high light transmitting property is dispersed in the resin, the adverse effect of moisture can preferably be prevented.

Figure 10B:
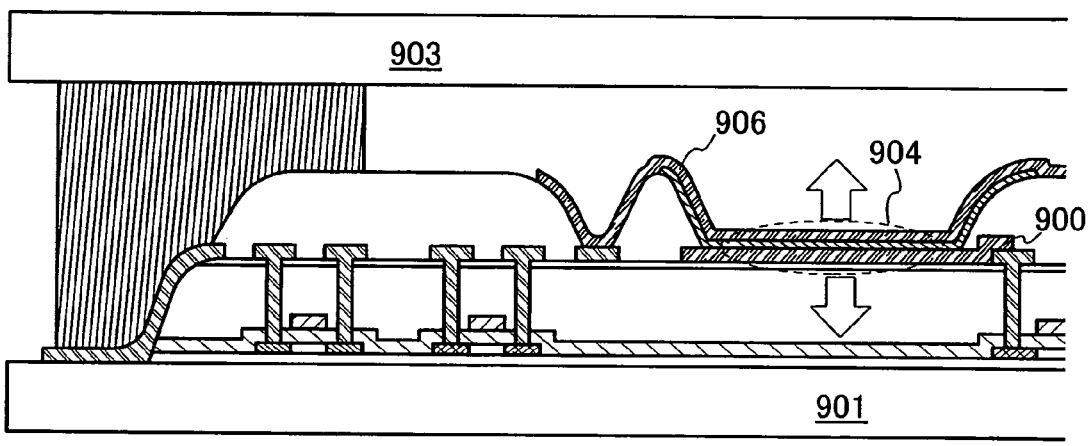

FIG. 10B shows an example of a dual-emission type light emitting display with a structure in which the first electrode 900 and a second electrode 906 are formed of transparent conductive films and light can be emitted toward both the substrate 901 and the counter substrate 903. In this structure, backgrounds can be prevented from being seen through screens by providing polarizing plates on the outer sides of the substrate 901 and the counter substrate 903, which increases the visibility. Protective films are preferably formed on the outer sides of the respective polarizing plates.

Figure 10C:
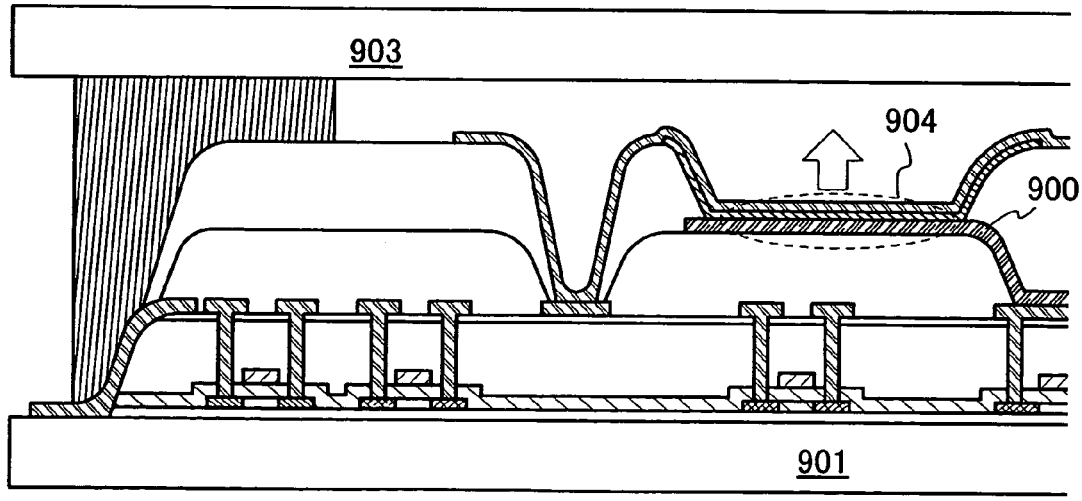

FIG. 10C shows an example of a top-emission type light emitting device with a structure in which the second electrode 906 is formed of a transparent conductive film and light is emitted toward the counter substrate 903. Since the light emitting element 904 and wirings of thin film transistors are formed in different layers, another thin film transistor can be formed under the light emitting element 904. This structure is superior in the aperture ratio.

Meanwhile, since ITO and ITSO, which are used to serve as transparent electrodes in the cases of the dual-emission and the top-emission, are difficultly formed by vapor deposition using resistive heating, they are mainly formed by sputtering. When the second electrode 906 is formed by sputtering, a surface of an electron injecting layer or an interface between the electron injecting layer and an electron transporting layer is sometimes damaged by sputtering. This might adversely affect the characteristics of the light emitting element. In order to prevent this problem, a material that is hardly damaged by sputtering may be formed at a closest position to the second electrode 906. As a material capable of forming an electroluminescent layer among the materials that are hardly damaged by sputtering, molybdenum oxide (MoOx) can be cited. However, MoOx is suitable as a hole injecting layer, and hence, the second electrode 906 is necessary to serve as an anode in order to form MoOx to be in contact with the second electrode 906. An element in which the first electrode serves as a cathode and the second electrode serves as an anode is referred to as a reversely laminated element in this specification by way of experiment.

Differing from the case of forming a sequentially laminated element of the present embodiment as shown in FIG.

Figure 11:
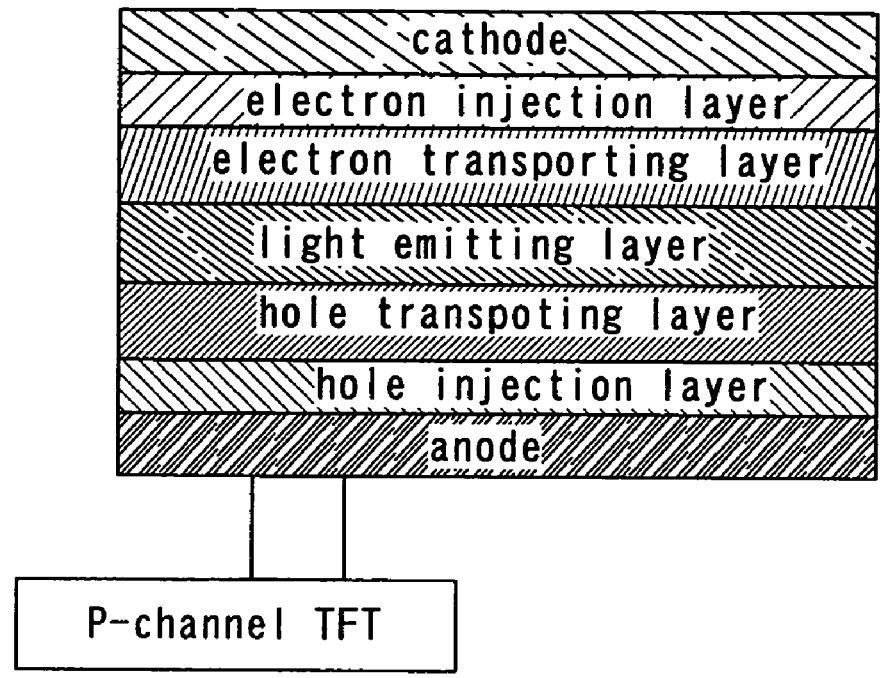
FIGS. 11A and 11B are views showing configuration examples of light emitting elements.
Figure 11:
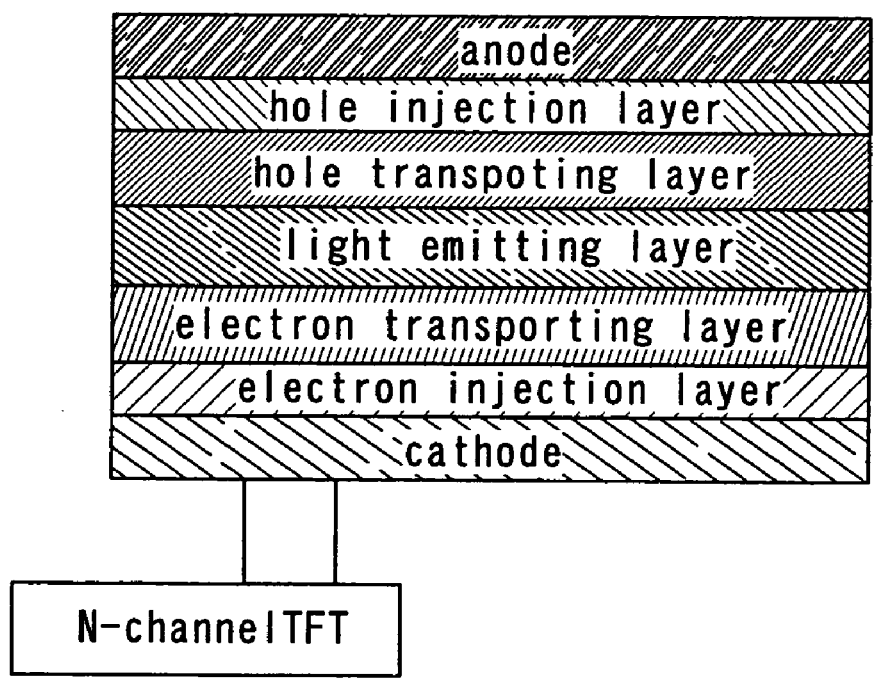

11A, in the case of the reversely laminated element, the first electrode is formed as the cathode, and then the electron injecting layer, the electron transporting layer, the light emitting layer, the hole transporting layer, the hole injecting layer ($MoO_x$) and the second electrode (anode) are laminated in order, as shown in FIG. 11B. It is necessary that a thin film transistor for driving a pixel is an n-channel type. The present embodiment employs a p-channel thin film transistor as a thin film transistor for driving a light emitting element. When the reversely laminated element is used, however, all transistors within the substrate can be n-channel transistors.

$MoO_x$ is formed by vapor deposition, and it is preferable that x be equal to or greater than 3. Moreover, an $MoO_x$ layer may be a mixed layer of an organic ands inorganic materials by co-depositing with an organic material or an organic metal complex such as copper phthalocyanine (CuPc). In the case of using the reversely laminated element, a thin film transistor of the pixel portion preferably employs a transistor using an a-Si:H that is originally N-type as its semiconductor layer so that the process can be simplified. When the driver circuit portion is formed over the same substrate, only the driver circuit portion may be crystallized by the laser irradiation.

Embodiment 5

A pixel circuit, a protective circuit and operations thereof will be described in the present embodiment.

Figure 12A:
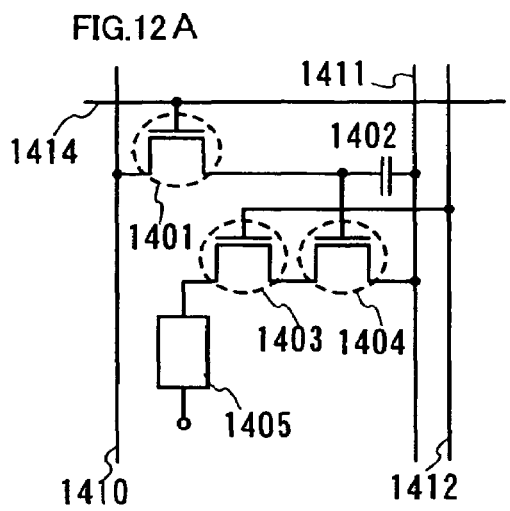
FIGS. 12A to 12F are equivalent circuit diagrams of pixel circuits in a light emitting element.

FIG. 12A illustrates a pixel in which a signal line 1410 and power supply lines 1411 and 1412 are arranged in columns and a scanning line 1414 is arranged in a row. The pixel further comprises a switching TFT 1401, a driver TFT 1403, a current controlling TFT 1404, a capacitor element 1402 and a light emitting element 1405.

Figure 12B:
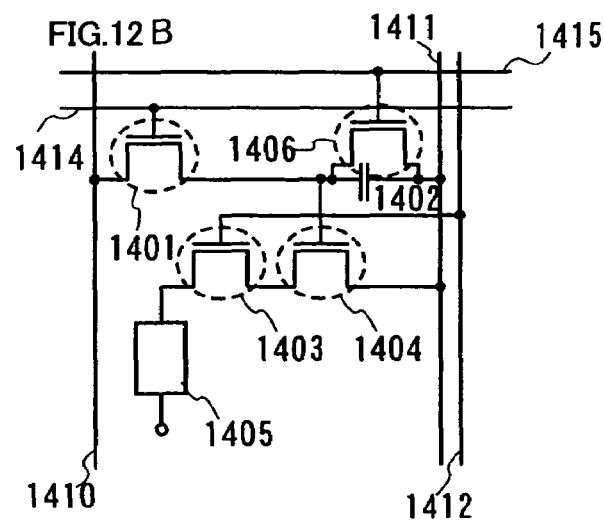
Figure 12C:
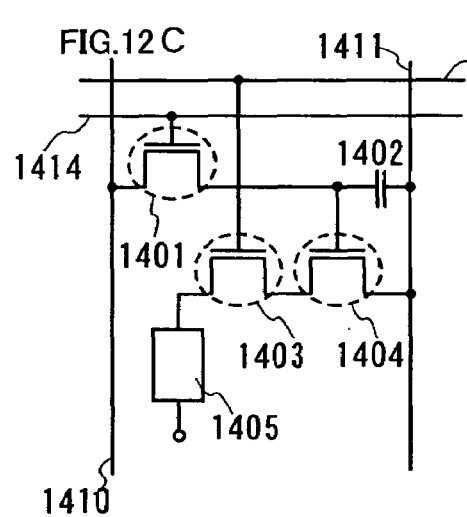

A pixel as shown in FIG. 12C has a similar configuration to the one as shown in FIG. 12A, except that a gate electrode of the driver TFT 1403 is connected to a power supply line 1412 that is arranged in a row. That is, both pixels in FIGS. 12A and 12C show same equivalent circuit diagrams. However, respective power supply lines are formed of conductive films placed in different layers, wherein the power supply line 1412 is arranged in a column (FIG. 12A) and the power supply line 1412 is arranged in a row (FIG. 12C). In order to pay attention to the wirings to which the gate electrodes of respective driver TFTs 1403 are connected and to show the different arrangements of these wirings, the equivalent circuit diagrams are individually illustrated in FIGS. 12A and 12C.

In each pixel as shown in FIGS. 12A and 12C, the TFTs 1403 and the TFTs 1404 are connected in series in each pixel. The channel length L(1403) and the channel width W(1403) of the TFT 1403 and the channel length L(1404) and the channel width W(1404) of the TFT 1404 are preferably set to satisfy the following relation: L(1403)/W(1403): L(1404)/W(1404)=5 to 6,000:1.

The TFT 1403 is operated in a saturation region and serves to control the amount of current flowing through the light emitting element 1406, whereas the TFT 1404 is operated in a linear region and serves to control a current supplied to the light emitting element 1406. The both TFTs 1403 and 1404 preferably have a same conductivity in view of the manufacturing process. In the present embodiment, n-channel TFTs are used as the TFTs 1403 and 1404. As the TFT 1403, a depletion type TFT may be used besides an enhancement type TFT. According to the invention having the above configuration, slight variation in Vgs of the TFT 1404 does not adversely affect the amount of current flowing through the light emitting element 1406, since the TFT 1404 is operated in a linear region. That is, the amount of current flowing through the light emitting element 1406 can be determined by the TFT 1403 operated in the saturation region. Accordingly, it is possible to provide a display device in which image quality is improved by improving variation in luminance of the light emitting element due to variation of the TFT characteristics.

The switching TFTs 1401 of the respective pixels as shown in FIGS. 12A to 12D control input of video signals to each pixel. When the TFT 1401 is turned ON and a video signal is inputted to the pixel, a voltage of the video signal is stored in the capacitor element 1402. Although the configurations in which the respective pixels include the capacitor elements 1402 are shown in FIGS. 12A and 12C, the invention is not limited thereto. When a gate capacitor or the like can also serve as a capacitor for holding a video signal, the capacitor element 1402 is not necessarily provided.

Figure 12D:
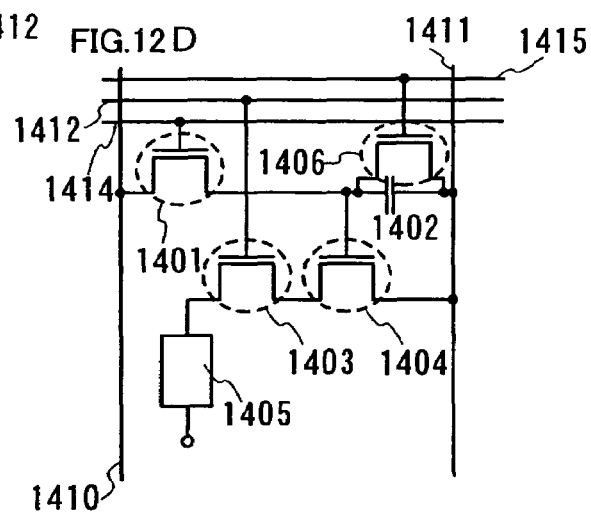

A pixel as shown in FIG. 12B has a similar configuration to the one shown in FIG. 12A, except that a TFT 1406 and a scanning line 1415 are added thereto. Similarly, a pixel as shown in FIG. 12D has a similar configuration to the one shown in FIG. 12C, except that a TFT 1406 and a scanning line 1415 are added thereto.

The TFT 1406 is controlled to be turned ON/OFF by the newly provided scanning line 1415. When the TFT 1406 is turned ON, charges held in the capacitor element 1402 are discharged, thereby turning the TFT 1404 OFF. That is, supply of a current to the light emitting element 1405 can be forcibly stopped by providing the TFT 1406. The TFT 1406 can, thus, be referred to as an erasing TFT. Therefore, a lighting period can start simultaneously with or immediately after a writing period starts before signals are written in all the pixels according to the configurations as shown in FIGS. 12B and 12D, thus, the duty ratio can be improved.

Figure 12E:
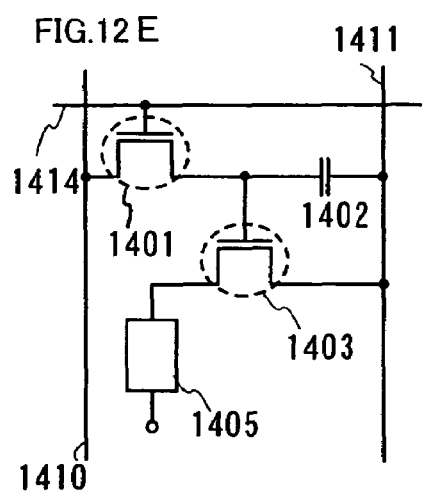
Figure 12F:
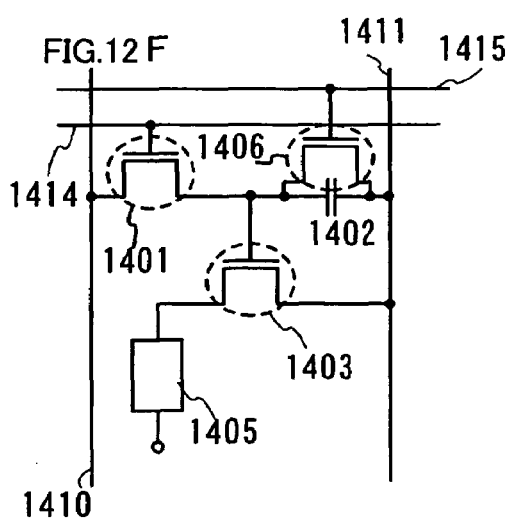

In a pixel as shown in FIG. 12E, a signal line 1410 and a power supply line 1411 are arranged in columns, and a scanning line 1414 is arranged in a row. The pixel further includes a switching TFT 1401, a driver TFT 1403, a capacitor element 1402 and a light emitting element 1405. A pixel as shown in FIG. 12F has a similar configuration to the one as shown in FIG. 12E, except that a TFT 1406 and a scanning line 1415 are added thereto. It is to be noted that the configuration depicted in FIG. 12F also allows a duty ratio to be improved by providing the TFT 1406.

As set forth above, various types of pixel circuits can be employed. In particular, when a thin film transistor is made from an amorphous semiconductor film, a semiconductor film of a driver TFT is preferably made larger. Therefore, a top-emission type light emitting device in which light generated in an electroluminescent layer is emitted through a sealing substrate side is preferably formed using the foregoing pixel circuits.

When pixel density is increased in such an active matrix light emitting device, the device can be driven at a low voltage since TFTs are formed in each pixel. Therefore, the active matrix light emitting device is advantageous.

Although the active matrix light emitting device in which TFTs are provided in each pixel is described in this embodiment, a passive matrix light emitting device in which TFTs are provided in each row can also be fabricated. Since the TFTs are not formed in each pixel in the passive matrix light emitting device, a high aperture ratio can be achieved. In the case of a passive matrix type light emitting device in which light is emitted toward both sides of an electroluminescent layer, the light transmittance is improved.

Subsequently, a case in which diodes are formed as protective circuits in a scanning line and a signal line will be described using the equivalent circuit as shown in FIG. 12E.

Figure 13:
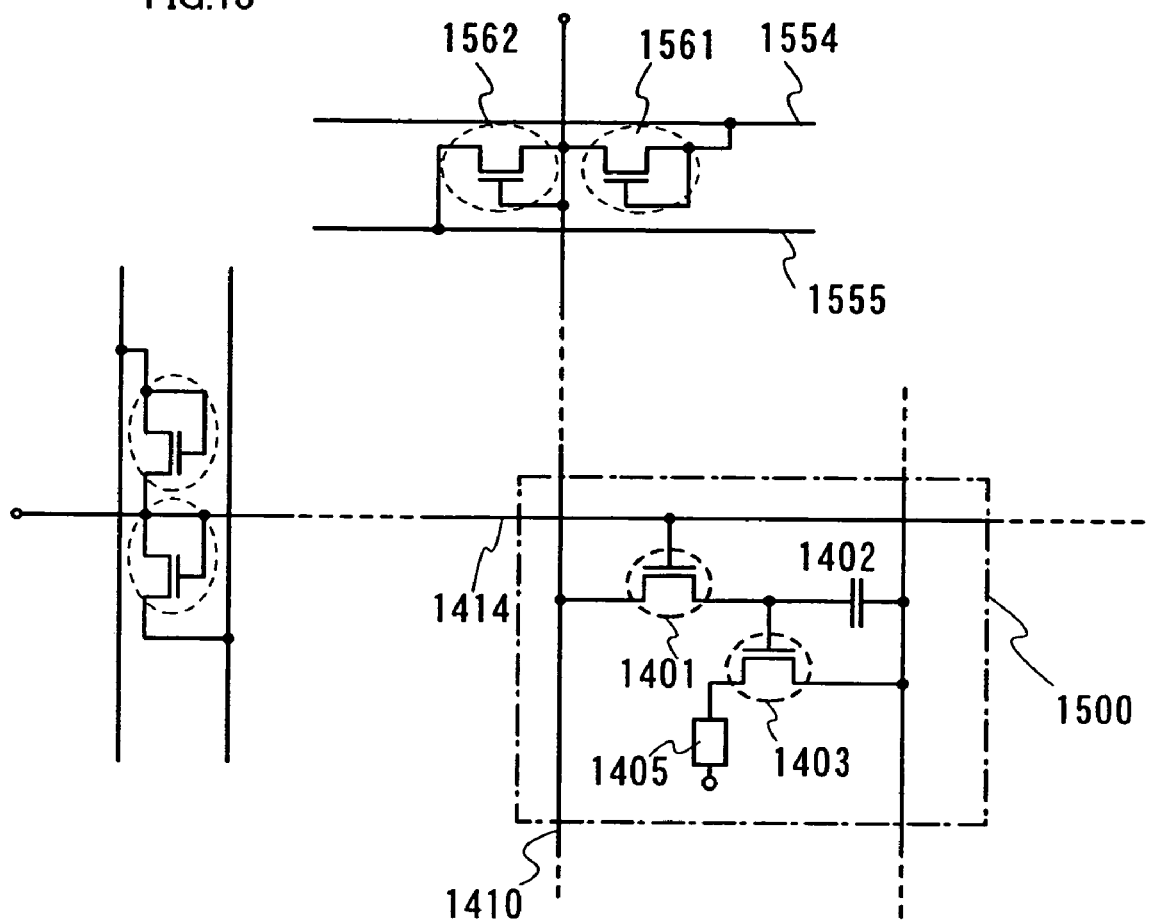
FIG. 13 is an equivalent circuit diagram of a protective circuit in a light emitting device.

FIG. 13 shows a pixel portion 1500 comprising TFTs 1401 and 1403, a capacitor element 1402 and a light emitting element 1405. Diodes 1561 and 1562 are provided in the signal line 1410. The diodes 1561 and 1562 are formed in accordance with the above-mentioned embodiment as well as the TFTs 1401 and 1403, and comprise gate electrodes, semiconductor layers, source electrodes, drain electrodes and the like, respectively. The diodes 1561 and 1562 are respectively operated by connecting the gate electrodes to the drain or source electrodes.

Common potential lines 1554 and 1555 each of which is connected to the diodes are formed in the same layer as the gate electrodes. Accordingly, contact holes are necessary to be formed in a gate insulating layer such that the source or drain electrodes of the respective diodes are connected to the common potential lines.

Diodes formed in the scanning line 1414 have the same structure.

According to the present invention, the protective diodes formed in an input stage can simultaneously be formed. Note that the positions of the protective diodes are not limited to the above-mentioned structure, and the protective diodes can be formed between the driver circuit and the pixel.

Embodiment 6

Figure 18A:
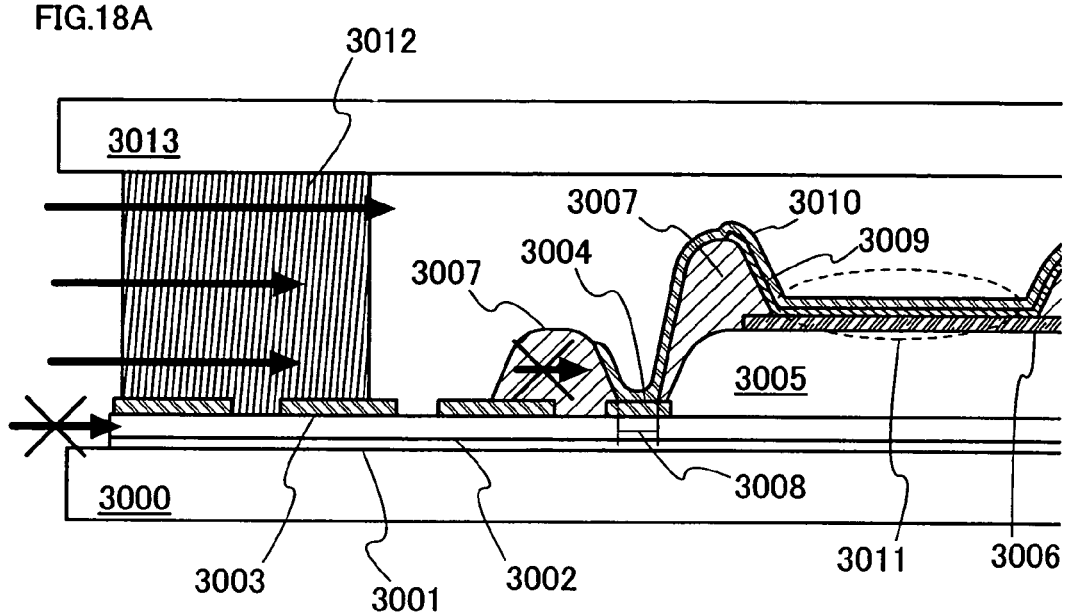
FIGS. 18A and 18B are cross sectional views showing a light emitting device of Embodiment 6 and a light emitting device of a comparative example, respectively.
Figure 18B:
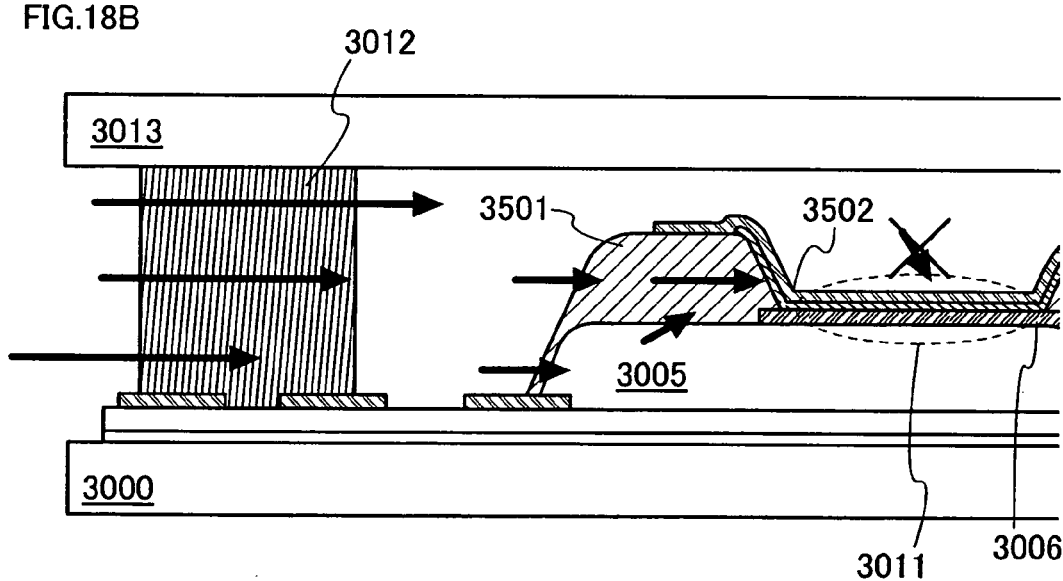

An embodiment of the invention having the structure as shown in FIG. 4B will be described with reference to FIGS. 18A and 18B and FIGS. 19A and 19B. FIG. 18A is a cross sectional schematic view showing a light emitting device manufactured according to the present embodiment while FIG. 18B is a cross sectional schematic view showing a light emitting device manufactured as a comparative example.

In the light emitting device according to the present embodiment as shown in FIG. 18A, a base insulating film 3001 is formed on a substrate 3000. A first interlayer insulating film 3002 that corresponds to the first interlayer insulating film 507 in FIG. 4B is formed on the base insulating film. Conductive films 3003 that corresponds to the wirings are formed in the peripheral portion on the first interlayer insulating film 3002. A second interlayer insulating film 3005 that corresponds to the second interlayer insulating film 511 in FIG. 4B is formed inside of the peripheral portion. The edge of the second interlayer insulating film 3005 is formed inside of the inner edge of a sealing material 3012. A first electrode 3006 of a light emitting element 3011 is formed over the second interlayer insulating film 3005. A partition wall 3007 is formed to cover the second interlayer insulating film 3005 and the first electrode 3006. In this embodiment, the outer edge of the partition wall 3007 is located outside of the outer edge of the second interlayer insulating film 3005. An opening corresponding to the first electrode 3006 is formed in the partition wall 3007. Additionally, an opening 3008 is formed outside of the edge of the second interlayer insulating film 3005 in the partition wall 3007 so as to pass through the partition wall in the thickness direction. A light emitting film 3009 is formed on the first electrode 3006 to continuously cover the inner edge of the opening corresponding to the first electrode 3006 formed in the partition wall. A second electrode 3010 of the light emitting element 3011 is formed to cover the light emitting film 3009 and the partition wall 3007. In the opening 3008 passing through the partition wall of the second electrode 3010 in the thickness direction, the second electrode 3010 covers the side face of the opening 3008 and the exposed underlying layer. The edge of the second electrode 3010 is positioned outside of the opening 3008. The element substrate having the above-described structure is attached with a counter substrate 3013 by using a sealing material 3012, thereby obtaining the light emitting device of the present embodiment.

Note that in order to determine the significance of the presence for the opening passing through the partition wall in the thickness direction and the side face thereof is covered with the second electrode of the light emitting element that are characteristics of the invention, transistors for a driver circuit portion and a pixel portion are not formed in the present embodiment. Therefore, a layer corresponding to the gate insulating film is not formed.

The substrate 3000 and the counter substrate 3013 are made of glass substrates, respectively. The base insulating film 3001 and the first interlayer insulating film 3002 are made from silicon oxide. The wirings are formed of a lamination of titanium, titanium nitride, aluminum and titanium in this order on the first interlayer insulating film. The second interlayer insulating film 3005 is formed of siloxane; the first electrode of the light emitting element 3011, ITSO; the partition wall, polyimide; and the second electrode 3010 of the light emitting element 3011, aluminum. DMQd is used as a light emitting material for the light emitting film 3009.

FIG. 18B is a cross sectional schematic view of a light emitting device having a conventional structure that is manufactured as a comparative example. In FIG. 18B, the shapes and materials of the substrate 3000, the base insulating film 3001, the first interlayer insulating film 3002, the wirings 3003, the second interlayer insulating film 3005, the first electrode 3006 of the light emitting element 3011, the light emitting film 3009, the sealing material 3012 and the counter substrate are identical to those in FIG. 18A. The other portions have different shapes, though they are formed of same materials as corresponding portions in FIG. 18A. Although the edge of the partition wall 3501 is positioned outside of the edge of the second interlayer insulating film 3005 as well as FIG. 18A, an opening passing through the partition wall in the thickness direction is not formed in FIG. 18B. Further, the edge of the second electrode 3502 for the light emitting element is positioned inside of the edge of the partition wall 3501.

Note that the both light emitting devices in FIGS. 18A and 18B do not employ a drying agent.

Figure 19B:
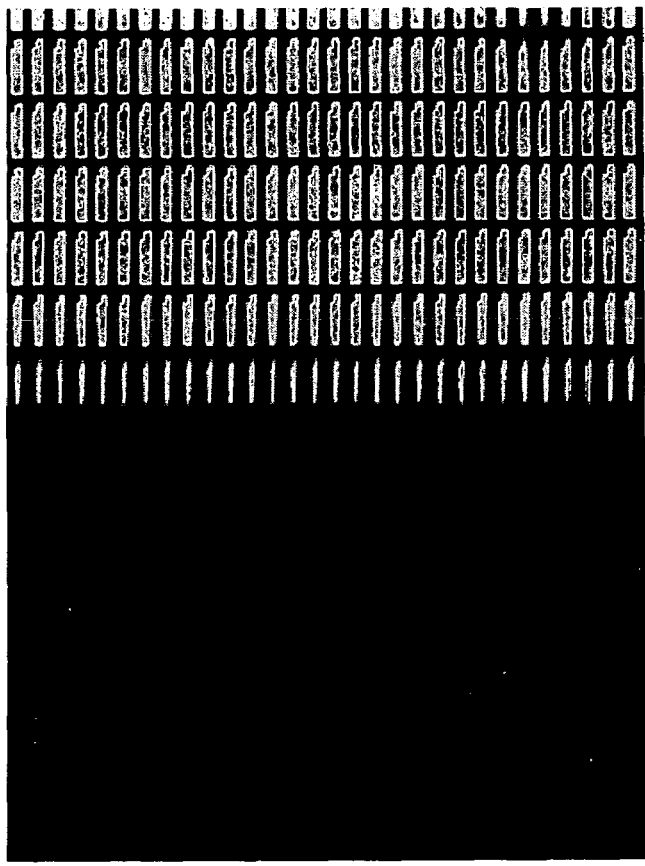
FIGS. 19A and 19B are photographs showing light-emitting states of pixels of Embodiment 6 and the comparative example after deterioration tests.
Figure 19A:
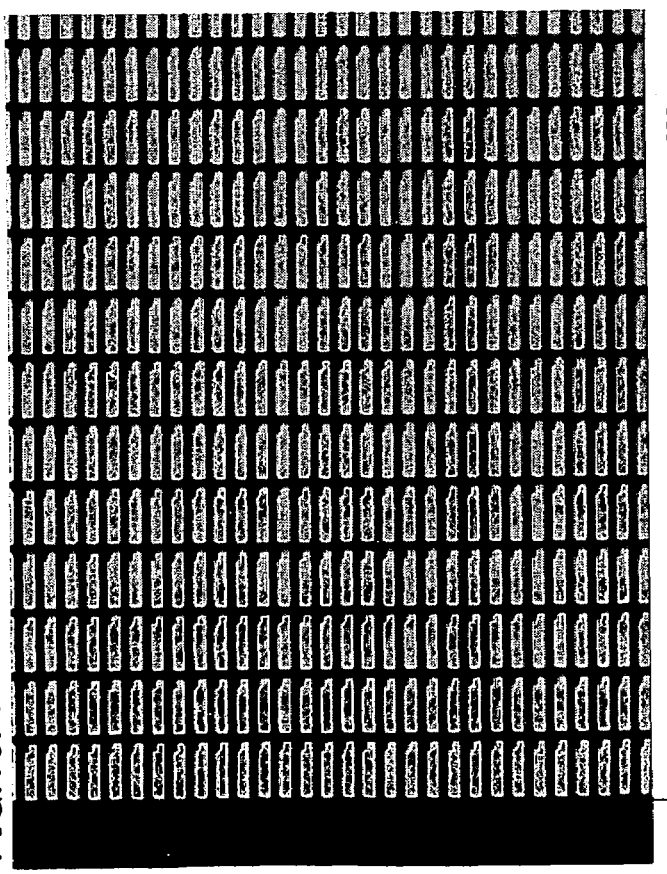

The foregoing two light emitting devices are manufactured and left under an atmosphere at a temperature of 65° C. at 95% humidity for same hours. Thereafter, light-emitting states in the periphery of respective pixel portions are photographed when the pixel portions emit light. FIG. 19A shows a photograph of the panel of Embodiment 6 that corresponds to FIG. 18A while FIG. 19B shows a photograph of the comparative example that corresponds to FIG. 18B. In FIGS. 19A and 19B, green portions represent the light emitting portions and respective green portions correspond to each pixel. Further, portions denoted by the pixel portions in the drawings coincide with the respective pixel portions, wherein the left side of each pixel portion is a peripheral portion of the substrate and the right side thereof is an inner portion of the substrate.

Deterioration in luminance is not seen in the pixels in FIG. 19A that is the photograph of the light emitting device of Embodiment 6 whereas deterioration in luminance is seen in FIG. 19B that is the photograph of the comparative example, in which the deterioration is caused around the peripheral portion of the pixel portion toward the inner portion of the pixel portion.

Consequently, as compared with the light emitting device of the comparative example, the light emitting device of the invention can inhibit ingress of moisture from the outside,

What is claimed is:

1. A display device comprising;
   a pixel portion;
   an interlayer insulating film over a substrate;
   a first film on the interlayer insulating film;
   a second film which is provided on an edge of the interlayer insulating film and in direct contact with the substrate;
   a light emitting element comprising a light emitting film formed between a first electrode and a second electrode, and formed in the pixel portion wherein the first electrode is formed on the first film;
   a partition wall formed over an edge of the first electrode and formed over the first film; and
   an opening formed in the partition wall around a circumference of the pixel portion,
   wherein the second electrode covers the pixel portion, and
   wherein side and bottom faces of the opening are covered with the second electrode.

2. The display device according to claim 1, wherein the first film is an inorganic film.

3. The display device according to claim 1, wherein the first film is a metal film.

4. The display device according to claim 1, further comprising:
   a thin film transistor in the pixel portion,
   wherein the interlayer insulating film is covered with the first film.

5. The display device according to claim 4, wherein the second film is an inorganic film.

6. The display device according to claim 1, further comprising:
   a thin film transistor connected with the light emitting element,
   wherein the first film has a low water permeability, and is formed to cover the thin film transistor.

7. The display device according to claim 1, further comprising a driver circuit portion outside of the pixel portion,
   wherein the opening is positioned between the pixel portion and the driver circuit portion.

8. A display device comprising:
   a pixel portion;
   a light emitting element comprising a light emitting film formed between a first electrode and a second electrode, and formed in the pixel portion;
   a thin film transistor formed in the pixel portion;
   a first interlayer insulating film formed to cover over the thin film transistor;
   a film formed to cover the first interlayer insulating film;
   a second interlayer insulating film formed over the film;
   a first opening formed in the second interlayer insulating film around a circumference of the pixel portion;
   a partition wall formed over an edge of the first electrode; and
   a second opening overlapping the first opening and formed in the partition wall,
   wherein the second electrode covers the pixel portion,
   wherein side and bottom faces of the second opening are covered with the second electrode, and
   wherein the first electrode is formed on the second interlayer insulating film.

9. The display device according to claim 8, wherein the film is an inorganic film.

10. The display device according to claim 8, wherein the edge of the first interlayer insulating film is covered with a film with a low water permeability.

11. A display device comprising:
    a pixel portion;
    a light emitting element comprising a light emitting film formed between a first electrode and a second electrode, and formed in the pixel portion;
    a thin film transistor formed in the pixel portion;
    a first interlayer insulating film formed to cover over the thin film transistor;
    a second interlayer insulating film formed over the first interlayer insulating film;
    a first opening formed in the second interlayer insulating film around a circumference of the pixel portion;
    a partition wall formed over an edge of the first electrode; and
    a second opening overlapping the first opening and formed in the partition wall,
    wherein the second electrode covers the pixel portion,
    wherein side and bottom faces of the second opening are covered with a film, and
    wherein the first electrode is formed on the second interlayer insulating film.

12. The display device according to claim 11, wherein the film is a metal film.

13. The display device according to claim 11, wherein the film is the second electrode.

14. The display device according to claim 11, further comprising a driver circuit portion outside of the pixel portion,
    wherein the first opening is positioned between the pixel portion and the driver circuit portion.

15. A display device comprising:
    a pixel portion;
    a light emitting element comprising a light emitting film formed between a first electrode and a second electrode, and formed in the pixel portion;
    a thin film transistor formed in the pixel portion;
    an interlayer insulating film formed to cover over the thin film transistor;
    an opening formed in the interlayer insulating film around at least a part of a circumference of the pixel portion; and
    a partition wall formed over an edge of the first electrode,
    wherein side and bottom faces of the opening are covered with a film,
    wherein the partition wall is formed in contact with the film and covered with the second electrode,
    wherein the first electrode is formed on the interlayer insulating film, and
    wherein the second electrode is in contact with the film.

16. The display device according to claim 15, wherein the film is a metal film.

17. The display device according to claim 15, further comprising a driver circuit portion outside of the pixel portion,
    wherein the opening is positioned between the pixel portion and the driver circuit portion.

18. The display device according to claim 15, wherein the pixel portion is formed over a substrate and the bottom face of the opening reaches the substrate.

19. The display device according to claim 15, wherein the edge of the interlayer insulating film is covered with an inorganic film with a low water permeability.

20. A display device comprising:
    a pixel portion;
    a light emitting element comprising a light emitting film formed between a first electrode and a second electrode, and formed in the pixel portion;

a thin film transistor formed in the pixel portion;

a first interlayer insulating film formed to cover over the thin film transistor;

an opening formed in the first interlayer insulating film around at least a part of a circumference of the pixel portion;

a second interlayer insulating film formed over the first interlayer insulating film; and a partition wall formed over an edge of the first electrode, wherein side and bottom faces of the opening are covered with a film, wherein the second interlayer insulating film is formed in contact with the film and the first electrode, wherein the partition wall is formed in contact with the film and covered with the second electrode, wherein the first electrode is formed on the second interlayer insulating film, and wherein the second electrode is in contact with the film.

21. The display device according to claim 20, wherein the film is a metal film.

22. The display device according to claim 20, further comprising a driver circuit portion outside of the pixel portion,
   wherein the opening is positioned between the pixel portion and the driver circuit portion.

23. The display device according to claim 20, wherein the pixel portion is formed over a substrate and the bottom face of the opening reaches the substrate.

24. The display device according to claim 20, wherein the edge of the first interlayer insulating film is covered with an inorganic film with a low water permeability.

25. The display device according to claim 8, wherein the second opening is provided in an identical portion with the first opening.

26. The display device according to claim 11, wherein the second opening is provided in an identical portion with the first opening.

* * * * *

UNITED STATES PATENT AND TRADEMARK OFFICE
CERTIFICATE OF CORRECTION

PATENT NO. : 7,619,258 B2 Page 1 of 1
APPLICATION NO. : 11/077347
DATED : November 17, 2009
INVENTOR(S) : Tsuchiya et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 296 days.

Signed and Sealed this

Twenty-sixth Day of October, 2010

David J. Kappos
*Director of the United States Patent and Trademark Office*